(12) United States Patent
Hirosaki

(10) Patent No.: US 8,114,313 B2
(45) Date of Patent: *Feb. 14, 2012

(54) PHOSPHOR, PROCESS FOR PRODUCING THE SAME, AND LUMINESCENT DEVICE

(75) Inventor: Naoto Hirosaki, Ibaraki (JP)

(73) Assignee: National Institute for Materials Science, Tsukuba-Shi (JP)

( * ) Notice: Subject to any disclaimer, the term of this patent is extended or adjusted under 35 U.S.C. 154(b) by 781 days.

This patent is subject to a terminal disclaimer.

(21) Appl. No.: 12/096,555

(22) PCT Filed: Dec. 7, 2006

(86) PCT No.: PCT/JP2006/324477
§ 371 (c)(1), (2), (4) Date: Jun. 6, 2008

(87) PCT Pub. No.: WO2007/066732
PCT Pub. Date: Jun. 14, 2007

(65) Prior Publication Data
US 2009/0267482 A1      Oct. 29, 2009

(30) Foreign Application Priority Data

Dec. 8, 2005   (JP) .................................. 2005-355473

(51) Int. Cl.
*C09K 11/70* (2006.01)
*C09K 11/77* (2006.01)

(52) U.S. Cl. .......................... 252/301.6 R; 252/301.4 R

(58) Field of Classification Search ............ 252/301.4 F, 252/301.4 R, 301.6 R
See application file for complete search history.

(56) References Cited

U.S. PATENT DOCUMENTS

| 6,670,748 | B2 * | 12/2003 | Ellens et al. | 313/503 |
| 7,431,864 | B2 * | 10/2008 | Hirosaki | 252/301.4 R |
| 7,525,245 | B2 * | 4/2009 | Tamura et al. | 313/495 |
| 7,544,310 | B2 * | 6/2009 | Hirosaki | 252/301.4 F |
| 2003/0006400 | A1 | 1/2003 | Noguchi | |

(Continued)

FOREIGN PATENT DOCUMENTS

EP          0 155 047 A1     9/1985

(Continued)

OTHER PUBLICATIONS

U.S. Appl. No. 12/096,601, filed Jun. 6, 2008, Hirosaki.

(Continued)

*Primary Examiner* — Jerry Lorengo
*Assistant Examiner* — Lynne Edmondson
(74) *Attorney, Agent, or Firm* — Trojan Law Offices

(57) ABSTRACT

A blue phosphor, which has excellent durability and high brightness, and in particular a blue phosphor in a powder state, which can realize high-brightness luminescence upon exposure to an electron beam, are provided. The phosphor being characterized by comprising at least europium incorporated as a solid solution into an inorganic crystal having a crystal structure of an AlN crystal or an AlN solid solution crystal, wherein the phosphor emits divalent europium-derived fluorescence having a peak at a wavelength in the range of 430 nm to 500 nm upon exposure to an excitation source, is provided. In this case, it is more preferable that a predetermined metal element and silicon are incorporated therein. And a manufacturing method to manufacture such phosphor is also provided. Further, a lighting device comprising such blue phosphor is provided.

13 Claims, 12 Drawing Sheets

U.S. PATENT DOCUMENTS

| | | | |
|---|---|---|---|
| 2006/0054076 A1* | 3/2006 | Dwilinski et al. | 117/3 |
| 2006/0061263 A1* | 3/2006 | Sakuma et al. | 313/503 |
| 2006/0065878 A1* | 3/2006 | Sakane et al. | 252/301.4 F |
| 2006/0192178 A1 | 8/2006 | Hirosaki | |
| 2006/0226764 A1 | 10/2006 | Tamura | |
| 2006/0290269 A1 | 12/2006 | Fukuda | |
| 2007/0007494 A1 | 1/2007 | Hirosaki | |
| 2007/0018567 A1 | 1/2007 | Hirosaki | |
| 2007/0108896 A1 | 5/2007 | Hirosaki | |
| 2007/0194685 A1 | 8/2007 | Hirosaki | |
| 2007/0257231 A1 | 11/2007 | Hirosaki | |

FOREIGN PATENT DOCUMENTS

| | | |
|---|---|---|
| EP | 1264873 A | 11/2002 |
| JP | S60-206889 A | 10/1985 |
| JP | 62-167260 A | 7/1987 |
| JP | 2002-363554 A | 12/2002 |
| JP | 2003-055657 A | 2/2003 |
| JP | 2004-234690 | 8/2004 |
| JP | 2004-285363 A | 10/2004 |
| JP | 2005-112922 A | 4/2005 |
| JP | 3668770 B | 7/2005 |
| JP | 2005-255895 A | 9/2005 |
| JP | 2006-291035 A | 10/2006 |
| JP | 2006-335832 A | 12/2006 |
| WO | WO 2005/019376 A1 | 3/2005 |
| WO | WO 2005/052087 A1 | 6/2005 |
| WO | WO 2005087896 A1 * | 9/2005 |
| WO | WO 2006/016711 A1 | 2/2006 |

OTHER PUBLICATIONS

N. Hirosaki et al., "Characterization and properties of green-emitting beta-SiAlON: Eu powder phosphors for white light-emitting diodes", Appl. Phys. Lett., vol. 86, May 17, 2005, pp. 211905-1-211905-3, XP002542252.

N. Vandamme et al., "Liquid-phase sintering of aluminium nitride by europium oxide additives", J. Am. Chem. Soc., vol. 72, No. 8, 1989, pp. 1409-1414, XP002542253.

V. A. Izhevskiy et al., "Progress in SiAlON ceramics", Journal of the European Ceramic Society, vol. 20, 2000, pp. 2275-2295, XP002542254.

P. L. Wang et al., "Formation and densification of 21 R AlN-polytypoid", Journal of the European Ceramic Society, vol. 20, 2000, pp. 23-27, XP002542255.

Caldwell et al., Visible Luminescent Activation of Amorphous AlN:Eu Thin-Film Phosphors with Oxygen, MRS Internet Journal Nitride Semiconductor Research, 2001, pp. 1-5, 6-13, The Materials Research Society, United States.

Richardson et al., Thin-film electroluminescent devices grown on plastic substrates using an amorphous AlN:Tb3+ phosphor, Applied Physics Letters, 2002, pp. 2207-2209, 80-12, American Institute of Physics, United States.

Vetter et al., Intense ultraviolet cathodoluminescence at 318 nm from Gd3+-doped AlN, Applied Physics Letters, 2003, pp. 2145-2147, 83-11, American Institute of Physics, United States.

* cited by examiner

US 8,114,313 B2

PHOSPHOR, PROCESS FOR PRODUCING THE SAME, AND LUMINESCENT DEVICE

PRIORITY CLAIM

The present application is a U.S. National Stage Application under 35 U.S.C. 371 of PCT/JP2006/324477, filed on Dec. 7, 2006, which claims priority to Japanese Patent Application 2005-355473, filed on Dec. 8, 2005.

BACKGROUND OF THE INVENTION

1. Field of the Invention

The present invention relates to a phosphor comprising an ALN crystal (aluminum nitride crystal) or an ALN solid solution crystal as a host crystal and a manufacturing method thereof and an application thereof. More specifically, the application relates to a lighting device and an emission apparatus of an image display device utilizing features of the phosphor, that is, properties to emit a blue color having a peak spectrum in a wavelength range of 430 nm or longer and 500 nm and shorter. In particular, it relates to an image display device utilizing an excitation electron beam of 10 V or higher.

2. Description of Related Art

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a white light-emitting diode (LED: Light-Emitting Diode), and so on. In any of these applications, it is necessary to provide the phosphor with energy to excite the phosphor in order to have the phosphor emit the fluorescence and the phosphor is excited by an excitation source with high energy such as a vacuum ultraviolet ray, an ultraviolet ray, an electron beam, and a blue light so as to emit a visible light ray. However, the phosphor is exposed to such excitation source that the luminance of the phosphor tends to lower the degree of the brightness. Therefore, the phosphor having little degradation in the brightness is desired. Therefore, a sialon phosphor, an oxynitride phosphor, and a nitride phospher are proposed as a phosphor having little degradation in the brightness instead for the conventional phosphor such as silicate phosphor, phosphate phosphor, aluminate phosphor, and sulfide phosphor.

As an example of these sialon phosphors is manufactured in the following manufacturing process as generally described below. First, silicon nitride ($Si_3N_4$), aluminum nitride (AlN), and Europium oxide ($Eu_2O_3$) are mixed with predetermined molar ratios and the resultant mixture is fired by a hot press method in one atmospheric pressure (0.1 MPa) of nitrogen atmosphere at 1700° C. for one hour (for example, refer to Patent document 1). It was reported that α-sialon activated with Eu ion manufactured in the above process became a phosphor to emit a yellow light of wavelength range of 550 nm to 600 nm if it is excited by the blue light having a wavelength range of 450 to 500 nm. A phosphor in which a rare-earth element is added to β-type sialon is also known (refer to Patent document 2) and it is shown that phosphors activated by Tb, Yb, and Ag are those which emit a green light of 525 nm to 545 nm. It is also known that β-type sialon activated by $Eu^{2+}$ becomes a phosphor of green color (refer to Patent document 3).

As an example of the oxynitride phosphor, a blue phosphor activated by Ce having a host crystal of JEM phase (LaAl$(Si_{6-z}Al_z)N_{10-z}O_z$) (refer to Patent document 4) and a blue phosphor activated by Ce having a host crystal of $La_3Si_8N_{11}O_4$ (refer to Patent document 5) are known.

As an example of the nitride phosphor, a red phosphor activated by Eu having a host crystal of $CaAlSiN_3$ (refer to Patent document 6) is known. It is reported in Nonpatent document 1 that an orange or red phosphor having an emission peak from $Eu^{3+}$ ion in the range of 580 nm to 640 nm was obtained as an amorphous ceramic thin film of phosphor activated by trivalent Eu ion (i.e., AlN: $Eu^{3+}$) was synthesized by a magnetron sputtering method at the room temperature as a phosphor having AlN as a host. In Nonpatent document 2, it is reported that a phosphor of amorphous AlN thin film activated by $Tb^{3+}$ emits a green light having a peak at 543 nm upon excitation of an electron beam. In Nonpatent document 3, a phosphor of AlN thin film activated by $Gd^{3+}$ is reported. However, these kinds of phosphors based on AlN are amorphous thin films which are not suitable for any application of a light or an image display device.

As a blue phosphor for the application of the image display device (VFD, FED, SED, and CRT) having the electron beam as an excitation source, a phosphor having $YSiO_5$ as a host crystal and including solid-solved Ce (Patent document 7) and a phosphor of ZnS including a solid-solved emission ion such as Ag (Patent document 8) are reported.

The present inventor proposed a phosphor having an AlN structure crystal as a host crystal and including divalent Eu ion (i.e., AlN: $Eu^{2+}$) in Patent document 9 (not yet published). The phosphor can be obtained by firing a composite of AlN to which $Si_3N_4$ and $Eu_2O_3$ are added at a higher temperature than 1800° C. and shows a blue fluorescence derived from Eu as divalent Eu ions ($Eu^{2+}$) are stabilized by incorporating Si, Eu, and oxygen into the AlN crystal structure.

[Patent Document 1] Specification of Japanese Patent No. 3,668,770
[Patent Document 2] Japanese Patent Application Publication No. S60-206889
[Patent Document 3] Japanese Patent Application Publication No. 2005-255895
[Patent Document 4] WO 2005/019376
[Patent Document 5] Japanese Patent Application Publication No. 2005-112922
[Patent Document 6] WO 2005/052087
[Patent Document 7] Japanese Patent Application Publication No. 2003-55657
[Patent Document 8] Japanese Patent Application Publication No. 2004-285363
[Patent Document 9] Japanese Patent Application No. 2004-234690
[Nonpatent Document 1] Meghan L. Caldwell, et al., "Visible Luminescent Activation of Amorphous AlN: Eu Thin-Film Phosphors with Oxygen", MRS Internet Journal Nitride Semiconductor Research, Vol. 6, Num. 13, P 1-8, 2001.
[Nonpatent Document 2] H. H. Richardson, et al., "Thin-film electroluminescent devices grown on plastic substrates using an amorphous AlN: $Tb^{3+}$ phosphor," Applied Physics Letters, Vol. 80, No. 12, p. 2207-2209, 2002.
[Nonpatent Document 3] U. Vetter, et al., "Intense ultraviolet cathodoluminescence at 318 nm from $Gd^{3+}$-doped AlN," Applied Physics Letters, Vol. 83, No. 11, P 2145-2147, 2003.

SUMMARY OF THE INVENTION

Disclosure of the Invention

Problem to be Solved by the Invention

A blue phosphor which emits luminescence with high intensity and has high durability is in demand for the application to a plasma display and a white light LED utilizing an ultraviolet LED as an excitation source. Further, the prior art phosphor including oxynitride as a host is insulating material such that the emission intensity thereof is low even upon irradiation of the electron beam. Therefore, a phosphor that emits luminescence with high intensity upon irradiation of the electron beam is in demand for the application to the image display device such as FED based on the electron beam excitation.

An oxide phosphor disclosed in Patent document 7 which is used with an electron beam excitation might be deteriorated during use such that the emission intensity might be lowered, and thereby changing the color balance in the image display device. A sulfide phosphor disclosed in Patent document 8 might be decomposed during use such that sulfur might be scattered to contaminate the device.

An object of the present invention is to try to satisfy such demand and to provide a blue phosphor in a powder state that has better emission properties than the prior art sialon phosphor activated by a rare earth element and higher durability than the prior art oxide phosphor, and emits light with high intensity upon irradiation of the electron beam.

Means to Solve the Problem

The present inventor has found, as a result of intensive investigations on the nitrides or oxynitrides including at least Eu solid-solved in the AlN crystal or the AlN solid solution crystal under such a situation, that some of those having specific compositions, specific solid solution states, and specific crystalline phases can be a blue phosphor having an emission peak in the wavelength range of 430 nm or longer and 500 nm or shorter derived from the divalent Eu ion. Further, the present inventor has found some of those having specific compositions including metal element A (here, A is one or two or more kinds of elements selected from Mg, Ca, Sr, Ba, Zn, and Cd) and silicon and optionally oxygen (if necessary) as a solid solution have a strong emission intensity upon excitation by the ultraviolet ray and the electron beam and in particular are suitable for the image display device in which the electron beam is utilized as the excitation source.

According to Nonpatent documents 1, 2, and 3, it is reported that thin films composed of AlN amorphous thin films activated by $Eu^{3+}$, $Tb^{3+}$, and $Gd^{3+}$ emit light upon the electron beam excitation. However, inorganic compounds having the AlN crystal or the AlN solid solution crystal as a host including the metal element A and silicon have never been tried to be investigated in order to use them as phosphor. That is, the important discovery that the AlN or AlN solid solution crystal having a specific metal element and silicon solid-solved can be used as a phosphor that emits light with high intensity upon excitation by an ultraviolet ray and a visible light, and an electron beam or an X-ray has been made by the present inventor for the first time.

As a result of further intensive investigations on the basis of this discovery, a phosphor that shows a luminous phenomenon with high intensity in a specific wavelength range and a manufacturing method of the phosphor, and a lighting device and an image display device having superior properties have been successfully provided. It is more specifically described in the following (1) to (15).

(1) A phosphor comprising: an inorganic crystal having a crystal structure of an AlN crystal or an AlN solid solution crystal; and at least europium incorporated therein as a solid solution, wherein the phosphor emits fluorescence being derived from a divalent europium ion and having a peak at a wavelength in a range of 430 nm to 500 nm upon exposure to an excitation source.

(2) The phosphor according to the above (1) wherein the inorganic crystal having the crystal structure of the AlN solid solution crystal has a wurtzite-type AlN crystal structure, a crystal structure selected from $2H^{\delta}$; 27R; 21R; 12H; 15R; and 8H, or a crystal structure having an $Al(O, N)_4$ tetrahedron skeleton therein.

(3) The phosphor according to the above (1), further comprising: oxygen incorporated therein as a solid solution.

(4) The phosphor according to the above (1), further comprising: a metal element A (here, A is one or two or more kinds of elements selected from Mg, Ca, Sr, Ba, Zn, and Cd) and silicon incorporated therein as a solid solution.

(5) The phosphor according to the above (4) wherein the metal element A is Zn.

(6) The phosphor according to the above (4) wherein the metal element A is Ba.

(7) The phosphor according to the above (1) wherein a composition of the phosphor is given by $Eu_a A_b Al_c Si_d O_e N_f$ (here, a+b+c+d+e+f=1) and wherein following conditions are satisfied:

$0.00001 \leq a \leq 0.1$ (i), $0.0001 \leq b \leq 0.2$ (ii), $0.4 \leq c \leq 0.55$ (iii), $0.005 \leq d \leq 0.2$ (iv), $0.001 \leq e \leq 0.05$ (v), and $0.3 \leq f \leq 0.55$ (vi).

(8) The phosphor according to the above (1) wherein the excitation source is any one of a visible light, an electron beam, and an X-ray having a wavelength of 100 nm to 420 nm.

(9) A manufacturing method of a phosphor comprising: holding a raw material mixture comprising at least: Eu metal, oxide, carbonate, nitride, fluoride, chloride, oxynitride, or a combination thereof; A metal, oxide, carbonate, nitride, fluoride, chloride, oxynitride, or a combination thereof (here, A is one or two or more kinds of elements selected from Mg, Ca, Sr, Ba, Zn, and Cd); silicon nitride; and aluminum nitride, in a bulk density of 40% or less; and firing the thus-held mixture in a nitrogen atmosphere of 0.1 MPa to 100 MPa in a temperature range of 1500° C. or higher and 2200° C. or lower.

(10) The manufacturing method of the phosphor according to the above (9) wherein a content (atomic %) of silicon atom contained in the raw material mixture is lower than a content (atomic %) of aluminum atom.

(11) A lighting device comprising: an emission source emitting light of wavelength of 330 to 420 nm; and a phosphor, wherein the phosphor comprises a phosphor recited in the above (1).

(12) The lighting device according to the above (11), wherein the emission source comprises a LED or a LD, wherein the phosphor further comprises: a green phosphor having an emission peak at a wavelength of 520 nm to 550 nm by an excitation light of 330 to 420 nm; and a red phosphor having an emission peak at a wavelength of 600 nm to 700 nm by the excitation light of 330 to 420 nm.

(13) The lighting device according to the above (11), wherein the emission source comprises: a LED or a LD, and wherein the phosphor further comprises a yellow phosphor having an emission peak at a wavelength of 550 nm to 600 nm by an excitation light of 330 to 420 nm.

(14) An image display device comprising: an excitation source and a phosphor, wherein the phosphor comprises: a phosphor recited in the above (1).

(15) The image display device according to the above (14), comprising: any one of a fluorescent display tube (VFD), a field emission display (FED or SED), and a cathode-ray tube (CRT), wherein the excitation source is an electron beam whose acceleration voltage is from 10 V to 30 kV.

Effect of the Invention

The phosphor of the present invention includes, as a main component, an AlN crystal or an AlN solid solution crystalline phase in which divalent Eu ion is incorporated as a solid solution such that the emission intensity in the range of 430 nm to 500 nm is higher as compared to the prior art sialon and oxynitride phosphors, and thereby being excellent as a blue phosphor for applying to a white LED. In case the phosphor is exposed to the excitation source, the phosphor has the emission intensity unlikely to be lowered. Further, it is a useful phosphor that can be used suitably in VFD, FED, SED, and CRT since it emits light efficiently upon excitation of the electron beam.

Figure 1:
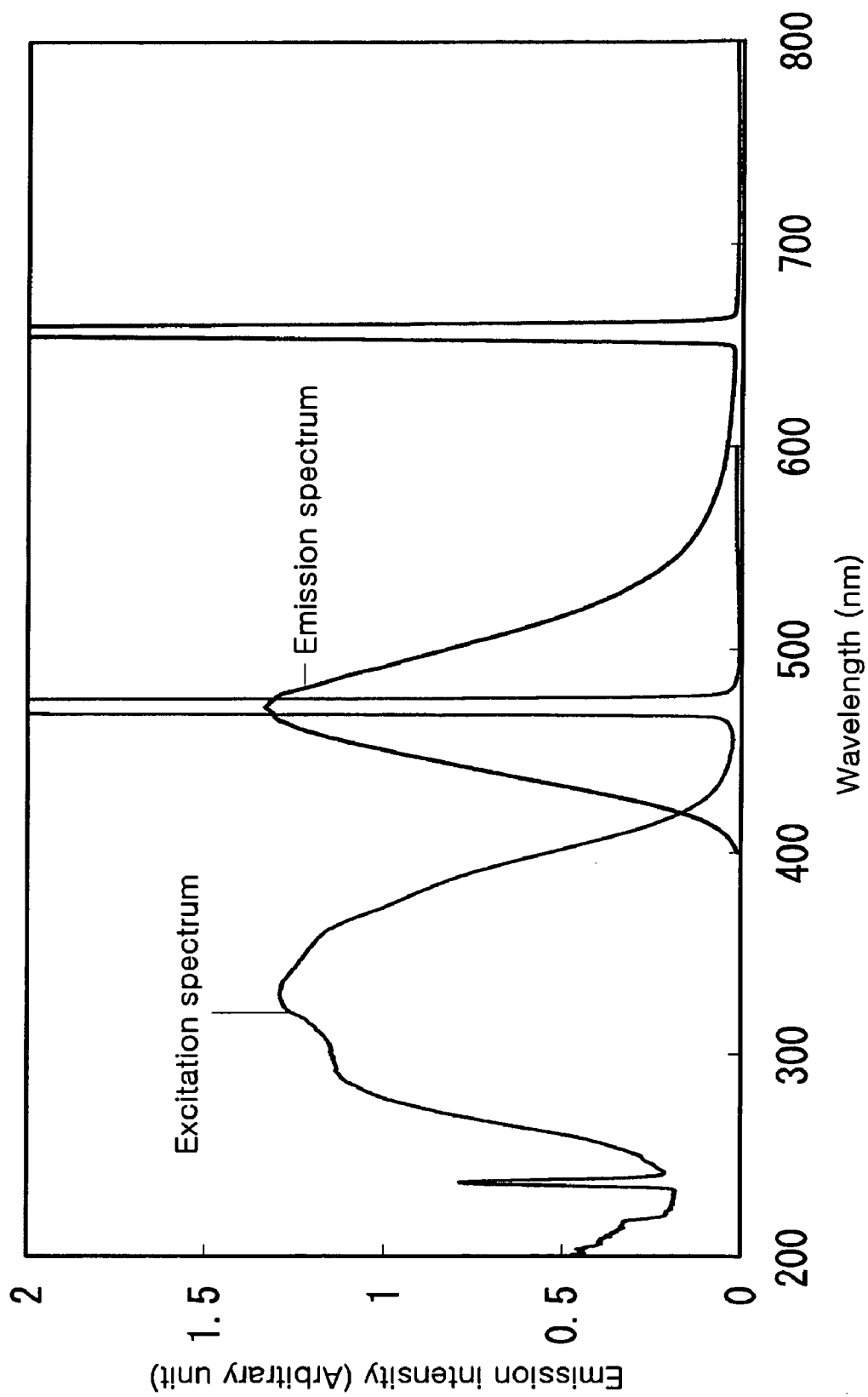
FIG. 1 shows an excitation spectrum and an emission spectrum measured in fluorescence measurement of Example 1.
Figure 2:
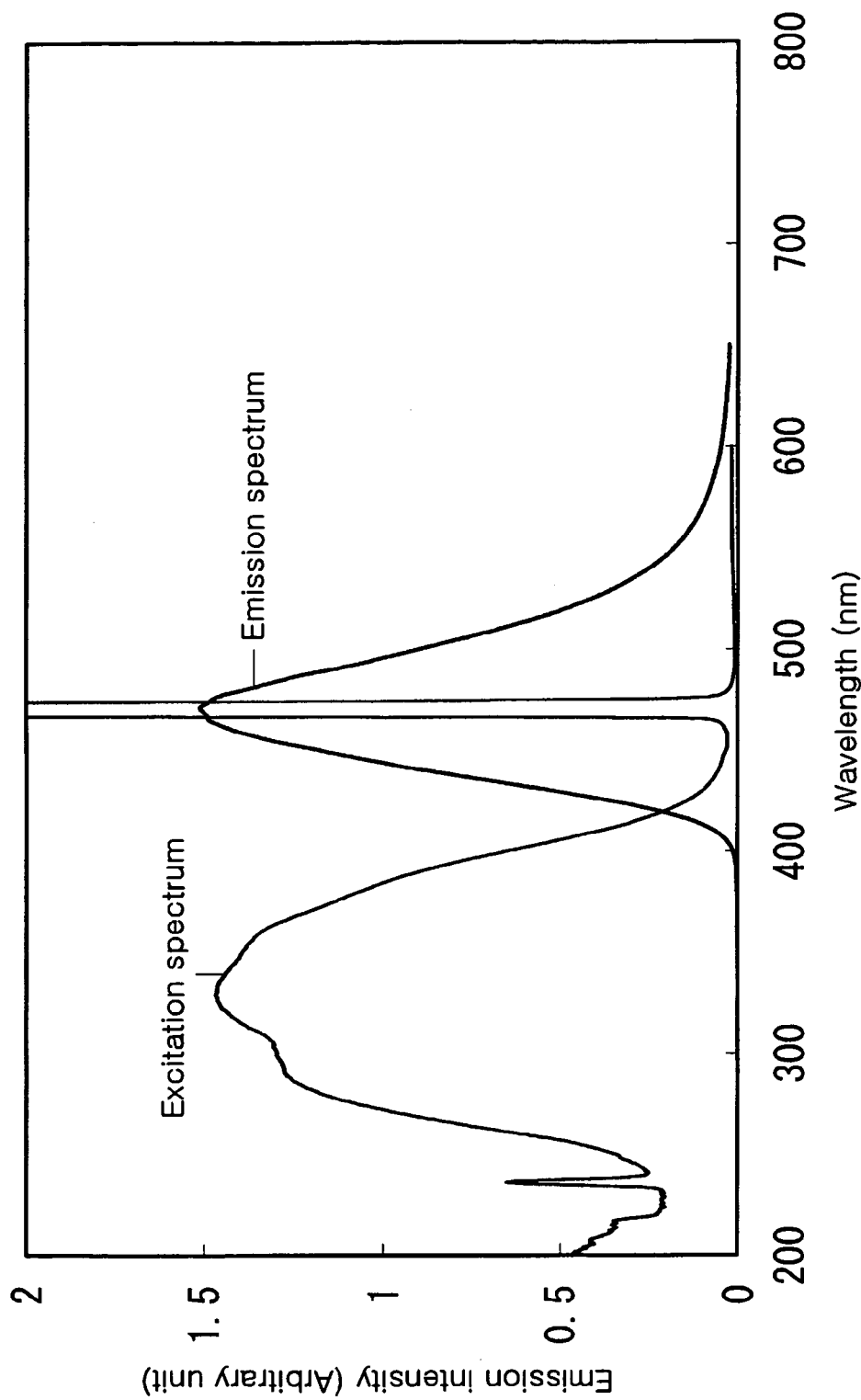
FIG. 2 shows an excitation spectrum and an emission spectrum measured in fluorescence measurement of Example 2.
Figure 3:
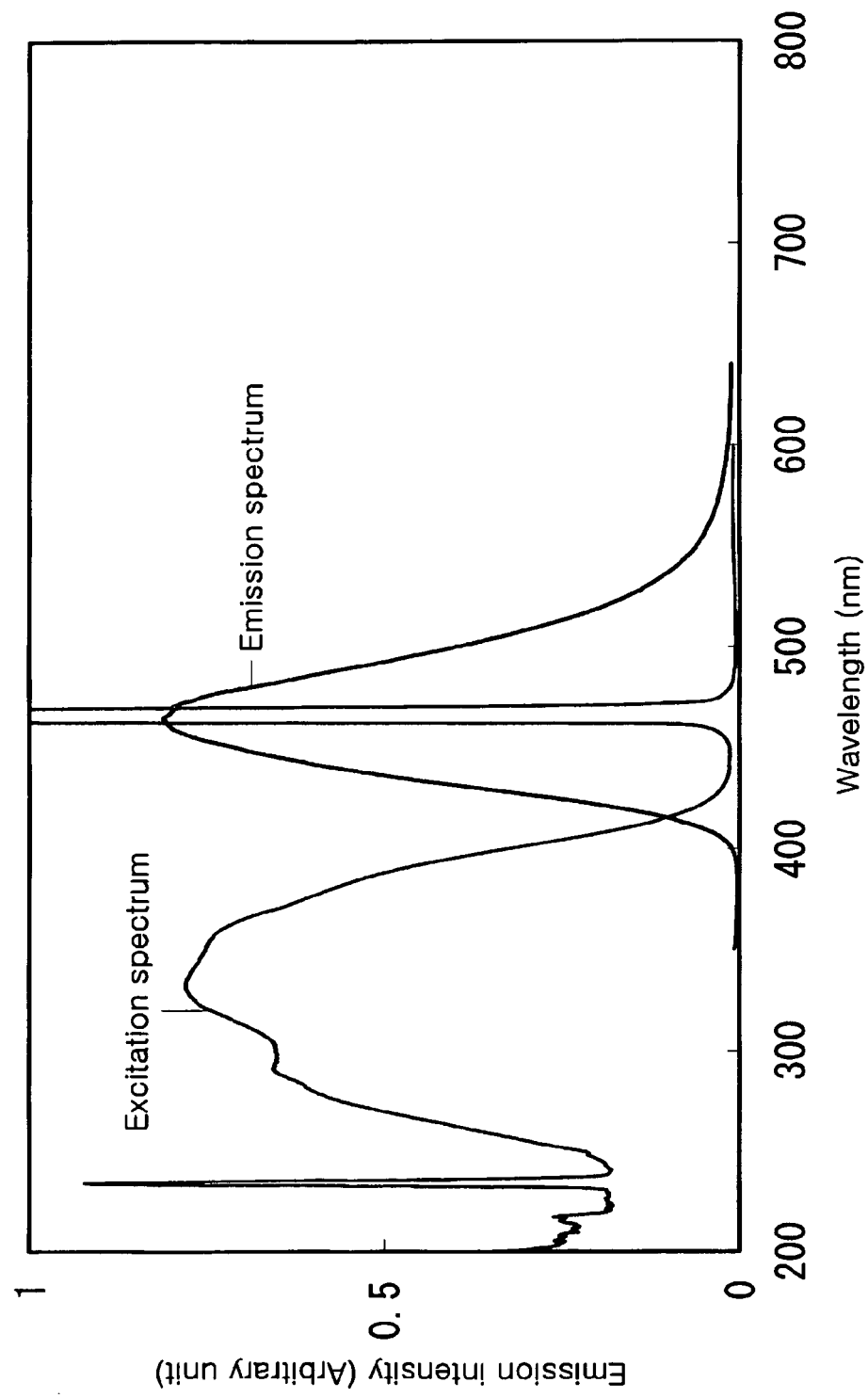
FIG. 3 shows an excitation spectrum and an emission spectrum measured in fluorescence measurement of Example 4.
Figure 4:
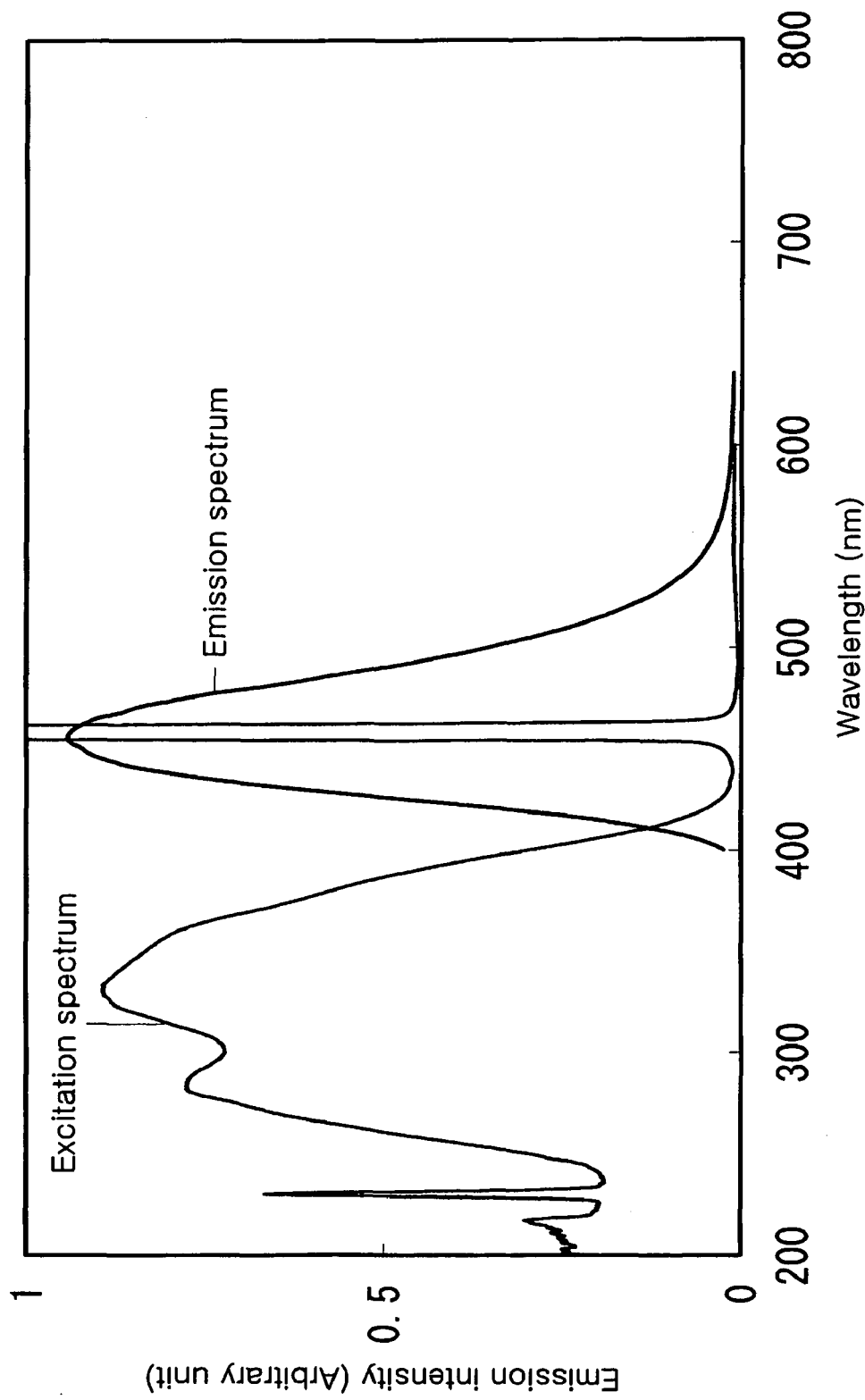
FIG. 4 shows an excitation spectrum and an emission spectrum measured in fluorescence measurement of Example 5.
Figure 5:
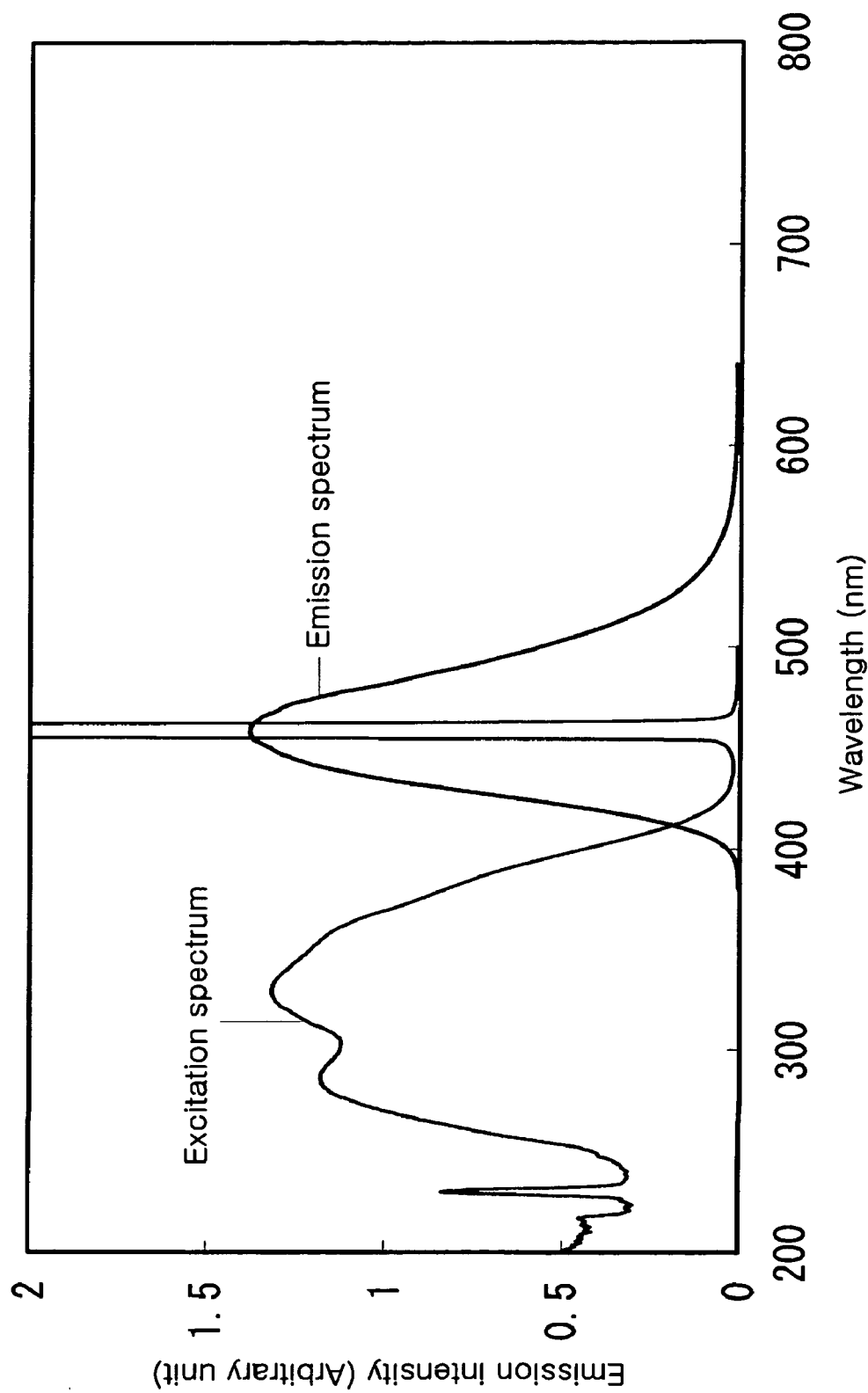
FIG. 5 shows an excitation spectrum and an emission spectrum measured in fluorescence measurement of Example 6.

| | Description Of Numeral References |
|---|---|
| 1 | mixture of a yellow phosphor and a blue phosphor of the present invention (Example 33); or mixture of a green phosphor and a red phosphor and a blue phosphor of the present invention (Example 33) |
| 2 | LED chip |
| 3, 4 | conductive terminals |
| 5 | wire bond |
| 6 | resin layer |
| 7 | container |

| | Description Of Numeral References |
|---|---|
| 8 | red phosphor |
| 9 | green phosphor |
| 10 | blue phosphor |
| 11, 12, 13 | ultraviolet-emitting cells |
| 14, 15, 16, 17 | electrodes |
| 18, 19 | dielectric layer |
| 20 | protection layer |
| 21, 22 | glass substrate |
| 51 | glass |
| 52 | cathode |
| 53 | anode |
| 54 | gate |
| 55 | emitter |
| 56 | phosphor |
| 57 | electron |

DETAILED DESCRIPTION OF THE INVENTION

Best Mode for Carrying Out the Invention

In the following, embodiments of the present invention are described in detail.

The phosphor of the present invention may include an AlN crystal or an AlN solid solution crystal as a main component. The AlN crystal is a crystal having a wurtzite-type crystal structure. The AlN solid solution crystal is a crystal in which silicon and oxygen are added to AlN. Further, it also includes a crystal to which a metal element A (wherein A is one or two or more kinds of elements selected from Mg, Ca, Sr, Ba, Zn, and Cd) is added. The AlN solid solution crystal includes a crystal having an $Al(O, N)_4$ tetrahedron skeleton in a crystal structure thereof. For example, there are crystals:

2H$\delta$: $Si_{2.40}Al_{8.60}O_{0.60}N_{11.40}$,
27R: $Al_9O_3N_7$:$1Al_2O_3$-7AlN,
21R: $Al_7O_3N_5$:$1Al_2O_3$-5AlN,
12H: $SiAl_5O_2N_5$:$1SiO_2$-5AlN,
15R: $SiAl_4O_2N_4$:$1SiO_2$-4AlN,
8H: $Si_{0.5}Al_{3.5}O_{2.5}N_{2.5}$: $0.5SiO_2$-$0.5Al_2O_3$-2.5AlN, and so on. These crystals have $Al(O, N)_4$ tetrahedron skeletons in their crystal structures. In the AlN solid solution crystal, solid-solved oxygen atoms may partially replace nitrogen atoms of the AlN crystal, and silicon atoms may partially replace Al atoms of the AlN crystal. Further, some AlN solid solution crystals may have a layered crystal structure in which solid-solved oxygen atoms and solid-solved silicon atoms form layers in which $Al(O, N)_4$ tetrahedrons are connected and the formed layers are stacked with a specific repetition interval. The above crystals 15R, 12H, 21R, 27R, and the like have the layered crystal structure. The metal element A may replace an Al atom in the crystal structure, or may be contained in the layer of $Al(O, N)_4$ tetrahedron rich in oxygen. These crystals having a variety of forms are also included in the AlN solid solution crystal.

In the present invention, the above crystals can be used as host crystals. The AlN crystal or the AlN solid solution crystal can be identified by means of the X-ray diffraction or neutron diffraction analysis. In addition to substances which show the identical or substantially identical X-ray diffraction patterns to that of the pure AlN crystal or the AlN solid solution crystal, a crystal having lattice parameters changed by substituting another element for a constituent element is also included as a part of the present invention.

In the present invention, a phosphor having excellent optical characteristics is obtained by using an AlN crystal or an AlN solid solution crystal as a host crystal, and by incorporating Eu, and if needed, a metal element A (one or two or more kinds of elements selected from Mg, Ca, Sr, Ba, Zn, and Cd) and silicon (Si) to form a solid solution with the host crystal. Here, Eu is an element serving as an optically active ion, and incorporated as a divalent ion. $Eu^{2+}$-derived light emission occurs by the excitation by an ultraviolet ray or an electron beam, and a phosphor which emits a blue light having a peak in a wavelength range of 430 nm to 500 nm is obtained.

The effect of the addition of silicon is thought as follows. Since Si is a tetravalent element, $Eu^{2+}$ being a divalent ion can be stabilized in the crystal by incorporating Si as a solid solution, and the Eu ion becomes more easily introduced into the crystal, thereby contributing to the improvement of phosphor brightness.

The effect of the addition of metal element A is thought as follows. The element A is an element which may serve as a divalent ion. The element A may be one or two or more kinds of elements selected from Mg, Ca, Sr, Ba, Zn, and Cd. It is thought that this metal element A has an effect to help Si incorporated into the crystal as a solid solution. Further, it is thought that there is also an effect to improve electric conductivity and enhance emission efficiency by the electron beam excitation when the divalent ion is introduced. In particular, a phosphor to which Zn or Ba is added has a high emission intensity upon the electron beam excitation.

As an embodiment of the present invention, a phosphor in which the element A is Zn and a phosphor in which the element A is Ba may be named. The phosphor in which the element A is Zn has a particularly high emission intensity upon the electron beam excitation, and is suitable for an application to an image display device utilizing the electron beam excitation. The phosphor in which the element A is Ba has a high emission intensity upon the electron beam excitation, and a peak wavelength of the fluorescence spectrum thereof shifts to a wavelength of 470 nm or shorter by the addition of Ba, thereby improving blue color purity. Therefore, the above phosphors are suitable for an application to a blue phosphor used for the image display device utilizing the electron beam excitation.

A composition which yields a phosphor having a high content ratio of the AlN crystal or the AlN solid solution crystal and a high brightness is given by a compositional formula $Eu_a A_b Al_c Si_d O_e N_f$ (in the formula, a+b+c+d+e+f=1) and the composition range thereof is preferably determined by the parameters selected from the values that satisfy the following all conditions.

$$0.00001 \leq a \leq 0.1 \quad (i)$$

$$0.0001 \leq b \leq 0.2 \quad (ii)$$

$$0.4 \leq c \leq 0.55 \quad (iii)$$

$$0.005 \leq d \leq 0.2 \quad (iv)$$

$$0.001 \leq e \leq 0.05 \quad (v)$$

$$0.3 \leq f \leq 0.55 \quad (vi)$$

Here, a parameter a expresses the addition amount of Eu which serves as a luminescence center and it is preferable to adjust it from 0.00001 to 0.1 in terms of the atomic ratio. When the value a is smaller than 0.00001, the number of Eu atoms to serve as the luminescence center may be too small and the emission intensity may be lowered. And when the value a is larger than 0.1, the brightness may be lowered due to the concentration quenching caused by interactions between Eu ions. The parameter b expresses the amount of the element A and it is preferable to adjust it from 0.0001 to 0.2 in terms of the atomic ratio. If the value b deviates from the above range, bonds in the crystal may become unstable and the ratio of formation of crystalline phases other than the AlN crystal and the AlN solid solution crystal may increase, thereby causing a decrease of the emission intensity. The parameter c expresses the amount of element Al and it is preferable to adjust it from 0.4 to 0.55 in terms of the atomic ratio. If the value c deviates from the above range, the ratio of formation of crystalline phases other than the AlN crystal and the AlN solid solution crystal may increase, thereby causing a decrease of the emission intensity. The parameter d expresses the amount of element Si and it is preferable to adjust it from 0.005 to 0.2 in terms of the atomic ratio. If the value d deviates from the above range, the solid solution of Eu may be prevented, thereby causing a decrease of the emission intensity. The parameter e expresses the amount of oxygen and it is preferable to adjust it from 0.001 to 0.05. If the value e is smaller than 0.001, the solid solution of Eu may be prevented, thereby causing a decrease of the emission intensity. If the value e is larger than 0.05, the ratio of formation of crystalline phases other than the AlN solid solution crystal may increase, thereby causing a decrease of the emission intensity. The parameter f expresses the amount of nitrogen and it is preferable to adjust it from 0.3 to 0.55. If the value f deviates from the above range, the ratio of formation of the crystalline phases other than the AlN crystal and the AlN solid solution crystal may increase, thereby causing a decrease of the emission intensity.

If the phosphor of the present invention is used in a powder state, it is preferable that the average particle diameter is from 0.1 μm to 20 μm in consideration of dispersibility and fluidability of the substance in a powder state. The emission intensity may be improved by making the powder substance single crystalline particles in this range.

Here, in this specification, the mean particle diameter is defined as follows. In the measurement by the sedimentation method, the particle diameter is defined as a diameter of an equivalent sphere having the same sedimentation rate, and in the laser scattering method, it is defined as a diameter of an equivalent sphere having the same scattering characteristics. Further, the distribution of particle diameters is called a particle size (particle diameter) distribution. In the particle diameter distribution, a specified particle diameter is defined as a mean particle diameter D50 when the total mass of powder particles having diameters larger than the specified particle diameter is 50% of the total mass of the entire powder body. These definition and term are well known to the one skilled in the art and are described in various documents such as JIS Z 8901 "Powder Body for Test and Particle for Test" and the first chapter of "Basic Physical Properties of Powder" edited by The Society of Powder Technology, Japan (ISBN4-526-05544-1). In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As to a means for determining the mean particle diameter, various kinds of means have been developed and the development is still being performed such that the value measured by a newly developed means may differ slightly. However, it should be understood that the meaning and significance of the mean particle diameter itself is definite, and the means for measuring the mean particle diameter is not necessarily limited to the above-mentioned means.

Since the phosphor of the present invention emits light efficiently by the excitation of the ultraviolet ray or visible light having a wavelength of 100 nm or longer and 420 nm or shorter, the phosphor is preferably applied to the white LED. Moreover, the phosphor of the present invention may also be excited by the electron beam or the X-ray. Since the phosphor of the present invention, in particular, emits the light more efficiently by the electron beam excitation than the other nitride phosphors, the phosphor is preferably applied to the image display devices in which the electron beam is used as the excitation source.

Fluorescence having a peak at a wavelength in the range of 420 nm to 500 nm is emitted by irradiating the phosphors of the present invention with the excitation source, and the color of the emitted light is blue of a good color purity having values (x, y) on the CIE chromaticity coordinates wherein $0 \leq x \leq 0.3$ and $0.01 \leq y \leq 0.3$.

In the present invention, it is desirable from a viewpoint of the fluorescence emission that the phosphor contains as much concentration of the AlN crystal or the AlN solid solution crystal of high purity being a constituent thereof as possible and the AlN crystal or the AlN solid solution crystal is more desirably composed of a single phase. The phosphor, however, may also be formed from a mixture with another crystalline phase or an amorphous phase as far as the fluorescence emission properties do not deteriorate. In this case, it is desirable that the content of the AlN crystal or the AlN solid solution crystal is 10 mass % or more, and it is more preferable that the content is 50 mass % or more in order to obtain the high brightness. The main component of the phosphor in the present invention contains at least 10 mass % or more of the AlN crystal or the AlN solid solution crystal. The ratio of the contents can be determined by the ratio of the intensities of the strongest peaks of the AlN crystal or the AlN solid solution crystal phase and the other crystalline phases obtained by X-ray diffraction measurements.

In the phosphor comprising a mixture with another crystalline phase or an amorphous phase, the phosphor can be formed from a mixture with an inorganic substance having electrical conductivity. In the VFD, FED, or the like, it is preferable that the phosphor has the electrical conductivity to some extent in order to discharge electrons outside without accumulating the electrons on the phosphor in case the phosphor of the present invention is excited by the electron beam. As conductive substances, oxide, oxynitride, nitride, or a mixture thereof containing one or two or more kinds of elements selected from Zn, Ga, In, and Sn may be named. In particular, indium oxide and indium tin oxide (ITO) are desirable since the fluorescence intensity is lowered only a little, but the electrical conductivity of the phosphor is rather high.

The phosphor of the present invention emits a blue color and if it is necessary to mix other colors such as yellow and red, inorganic phosphors which emit these colors can be mixed.

In the phosphors of the present invention, excitation spectra and fluorescence spectra vary according to compositions thereof such that it is possible to combine suitably and selectively these different phosphors in order to design phosphors emitting a variety of emission spectra. In an embodiment, the phosphor may be designed to obtain a necessary spectrum based on the application.

The method for producing the phosphor of the present invention is, in particular, not limited to, but the following method may be described as an example.

A raw material mixture is prepared which comprises: a metal, oxide, carbonate, nitride, fluoride, chloride, oxynitride or a combination thereof containing the element Eu; a metal, oxide, carbonate, nitride, fluoride, chloride, oxynitride or a combination thereof containing the element A (wherein A is one or two or more kinds of elements selected from Mg, Ca, Sr, Ba, Zn, and Cd); silicon nitride; and aluminum nitride. The preparation is preferably made so that the amount of silicon atoms (atomic %) contained in the raw material mixture becomes less than the amount of aluminum atoms (atomic %). Thus, a stable AlN crystal or an AlN solid solution crystal is obtained. Subsequently, the raw material mixture is filled into a container while maintaining a packing fraction of a relative bulk density of 40% or less, and fired in a temperature range of 1500° C. or higher and 2200° C. or lower in a nitrogen atmosphere in the range of 0.1 MPa or higher and 100 MPa or lower. In this way, the phosphor of the present invention in which at least Eu, metal element A and silicon are incorporated as a solid solution into the AlN crystal or the AlN solid solution crystal can be produced. The optimal firing temperature may change depending on compositions, but can be optimized suitably. In general, the firing is preferably performed in a temperature range of 1800° C. or higher and 2200° C. or lower. In this way, a phosphor of high-brightness is obtained. When the firing temperature is lower than 1800° C., it is thought that Eu serving as a luminescence center is not easily incorporated as a solid solution into the AlN crystal or the AlN solid solution crystal, and remains in a grain boundary phase thereof. In such a case, it is unlikely to obtain a phosphor that emits light of high intensity at a targeted wavelength since the emission is from a host oxide glass. When the firing temperature exceeds 2200° C., a special facility is required, which is industrially undesirable.

In Nonpatent documents 1 to 3, the phosphors are synthesized at a room temperature and luminescence center ions are incorporated into amorphous phases as a solid solution. That is, the emission wavelength derived from $Eu^{3+}$ shows a red color at 600 nm or longer in Nonpatent document 1 even when the same Eu is used as an activating element. Therefore, the emission wavelength of Nonpatent document 1 is intrinsically different from the emission wavelength derived from $Eu^{2+}$ which is from 430 to 500 nm of the phosphor of the present invention.

As a starting material of the metal element Eu, a metal, oxide, carbonate, nitride, fluoride, chloride or oxynitride of Eu element can be used. It is preferable to use europium oxide among them. This is because the europium oxide is easily obtained, and stable in air in a production process.

As a starting material of the metal element A, a metal, oxide, carbonate, nitride, fluoride, chloride, oxynitride of A or a combination thereof (wherein A is one or two or more kinds of elements selected from Mg, Ca, Sr, Ba, Zn, and Cd) can be used. It is preferable to use zinc oxide if A is Zn, and barium carbonate if A is Ba.

As a starting material of a silicon source, silicon metal, silicon oxide, silicon nitride, organic precursor containing silicon, silicondiimide, and amorphous substance obtained by heat-treating silicondiimide or the like can be used. However, the silicon nitride can commonly be used. These materials are reactive, can be obtained as a synthesized compound with high purity, and are readily available because the materials are produced as industrial raw materials. As the silicon nitride, α type, β-type or amorphous variation and a mixture thereof can be used.

As a starting material of an aluminum source, aluminum metal, aluminum oxide, aluminum nitride, organic precursor substance containing aluminum and the like can be used. However, it is usually preferable to use aluminum nitride. These materials have high reactivity, can be obtained as a synthesized compound with high purity, and are readily available because the materials are produced as industrial raw materials.

In order to enhance reactivity in firing, an inorganic compound which forms a liquid phase at the firing temperature or below can be added to a mixture of starting materials if necessary. As the inorganic compound, a substance which produces a stable liquid phase at the reaction temperature is preferred, and a fluoride, chloride, iodide, bromide, or phosphate of Li, Na, K, Mg, Ca, Sr, Ba, or Al is suitable. The above inorganic compounds may be added separately or as a mixture of two or more kinds thereof. In particular, barium fluoride and aluminum fluoride have high capability to enhance reactivity in the synthesis and hence are preferable. Although the amount of addition of the inorganic compound is not particularly limited to, but the amount of 0.1 weight part or more and 10 weight part or less is effectively added to 100 weight part of the mixture of the metal compounds constituting the starting materials so as to render a large effect. The reactivity is not so improved if the amount of addition is smaller than 0.1 weight part, and the brightness of the phosphor may be lowered if the amount is larger than 10 weight part. If the mixture to which the above inorganic compounds are added is fired, the reactivity is improved such that the particle growth is promoted in a comparatively short period of time so as to yield single crystals with large particle diameters, and the brightness of the phosphor becomes higher.

As the nitrogen atmosphere, a gaseous atmosphere may be in a pressure range that is at least 0.1 MPa and that does not exceed 100 MPa. It is more preferable to have the pressure range at least 0.5 MPa and not exceeding 10 MPa. When silicon nitride is used as a raw material and the firing process is performed at a temperature of 1820° C. or higher, the silicon nitride contained in the raw material decomposes easily in a nitrogen atmosphere of 0.1 MPa or lower so that the condition is not so preferable. It is high enough if the pressure is 10 MPa and it is not suitable for the industrial production if the pressure is 100 MPa or higher since special facilities are required.

When fine powder of a particle diameter of several micrometers is employed as a starting material, a mixture after completion of a mixing process exhibits morphology in which the fine powder of a particle diameter of several micrometers aggregates to a size of several hundreds of micrometers to several millimeters (hereinafter called "powder aggregate"). In the present invention, the powder aggregate is fired in a state maintaining a packing fraction of a bulk density that does not exceed 40%. Here, the relative bulk density is a ratio of the value (bulk density) obtained by dividing the weight of the powder filled in a container by the capacity of the container; to a value of the real density of the material of the powder. In a usual sialon production, the firing process is performed after the die molding (powder compacting) or by a hot-press method in which heat is applied as the pressure is applied. And hence the firing process is performed in a state that the powder packing fraction is high. In the present invention, however, the powder aggregate of a mixture in which the particle size is made uniform is charged into a container or the like as it is with a packing fraction of a bulk density that does not exceed 40% without applying any mechanical force or without molding in a die in advance. If necessary, the powder aggregate may be subject to particle size control by granulating to an averaged particle diameter that does not exceed 500 μm by using a sieve or an air classifier. Otherwise, the powder aggregate may be granulated directly into a shape of 500 μm or smaller by using a spray dryer. The container of boron nitride has an advantage of little reactivity with the phosphor.

The reason why the firing process is performed while the bulk density is kept not exceeding 40% is that the raw material powder is fired with a free space around the raw material powder. The most preferable bulk density may be 20% or less depending on the particle morphology and surface conditions of the particles. In this way, the reaction products grow as crystals into a free space such that it is plausible that the crystals have less chance to come into contact with each other and that crystals with a smaller number of surface defects are synthesized. Therefore, a phosphor with high brightness is obtained. When the bulk density exceeds 40%, partial densification takes place during the firing, and a dense sintered body appears, which hinders the crystal growth. As a result, the brightness of the phosphor may be reduced. And fine powder is hardly obtained. The size of the powder aggregate of 500 μm or smaller is particularly preferable to achieve excellent grinding properties after the firing.

Then, the powder aggregate having a packing fraction of 40% or smaller is fired under the above condition. A furnace used for firing is preferably heated by metal resistance heating or graphite resistance heating, and carbon is preferably used as the high temperature part of the furnace because the firing temperature is high and nitrogen is employed as the firing atmosphere. For firing, a sintering method in which no mechanical pressure is applied from the outside, such as normal pressure sintering and gas pressure sintering, is desirable to perform firing while keeping a predetermined range of bulk density.

When the powder aggregate obtained by firing is solidified hard, the aggregate is ground by using a mill usually employed in the factory, such as a ball mill, jet mill, and the like. Among them, the particle size is controlled most easily in ball milling. A silicon nitride sintered body or a sialon sintered body is preferable as the materials of balls and pots for the present purpose. Grinding is continued until an averaged particle diameter of 20 μm or smaller is reached. Particularly desirable averaged particle diameter is at least 20 nm and does not exceed 10 μm. When the averaged particle diameter exceeds 20 μm, the fluidity of the powder and dispersion into resin deteriorate, and emission intensity may become nonuniform from part to part when a light emitting device is built by combining the phosphor with a light-emitting device. When the averaged particle diameter reaches a level of 20 nm or smaller, it becomes more difficult to handle the phosphor powder. If an objective particle diameter is not obtained by grinding alone, classification may be used in combination with the grinding. Sieving, air classification, and settling in a liquid may be employed as means of classification.

Further, by washing the fired compound with a solvent for dissolving these inorganic compounds after the firing, the content amount of the inorganic compounds such as glass phases, a second phase, or impurity phases other than the phosphor contained in the reaction product is reduced such that the brightness of the phosphor is improved. As such solvent, water and aqueous solution of an acid can be used. As the aqueous solution of the acid, sulfuric acid, hydrochloric acid, nitric acid, hydrofluoric acid, a mixture of organic acid and hydrofluoric acid, and the like can be used. In particular, the mixture of sulfuric acid and hydrofluoric acid achieves a large effect. This processing is quite effective to the reaction product fired at a high temperature wherein the inorganic compounds yielding a liquid phase at the firing temperature or lower having been added to the product in advance.

Although fine phosphor powder is obtained through the above processes, the thermal treatment is effective in order to improve the brightness. For this purpose, the powder after firing or the powder after particle size adjustment by pulverization and classification can be subject to thermal treatment at a temperature that is at least 1000° C. and that does not exceed the firing temperature. At a temperature lower than 1000° C., the effect of removing surface defects is small. A temperature higher than or equal to the firing temperature is unpreferable because particles of the ground phosphor aggregate again with each other. An atmosphere suitable for thermal treatment depends on phosphor compositions. As for an atmosphere suitable for the heat treatment, the mixture atmosphere having one or more gases selected from nitrogen, air, ammonia and hydrogen can be used. Among them, a nitrogen atmosphere is particularly preferable since this atmosphere exhibits a pronounced effect of removing defects.

The thus-obtained phosphor of the present invention is characterized by an emission light of a visible light with the high emission intensity if compared to the ordinary oxide phosphor or the prior art sialon phosphor. In particular, the phosphor of a specific composition is characterized by a blue light emission having a peak in a range of 420 nm or longer and 500 nm or shorter, and hence it is suitable for a lighting device and an image display device. Further, the phosphor does not deteriorate even when exposed to high temperatures and then has superior thermal resistance, and excels in a long-term stability in an oxidizing atmosphere and moist environment.

The lighting device of the present invention is configured with at least an emission source and the phosphor of the present invention. The lighting device may include a LED lighting device, a fluorescent lamp, and the like. The LED lighting device can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, an emission source which emits light with a wavelength of 330 to 420 nm is preferred and, in particular, an ultraviolet (or violet) LED [light emitting device] or LD [laser diode] emitting device which emits light with the wavelength of 330 to 420 nm is preferred.

As such a light-emitting device, a device comprising: a nitride semiconductor such as GaN, InGaN, and the like may be named and the device can be an emission source to emit light at a predetermined wavelength by adjusting compositions thereof.

A lighting device which emits a desired color can be configured by using a phosphor having other light-emitting properties together rather than by using the phosphor of the present invention alone. An example of the lighting device may comprise: an ultraviolet LED or LD light-emitting device which emits an ultraviolet light with a wavelength of 330 to 420 nm; a yellow phosphor which has an emission peak at a wavelength of 550 nm or longer and 600 nm or shorter by the excitation of the ultraviolet light at the above-mentioned wavelength; and a blue phosphor of the present invention. As such a yellow phosphor, α-sialon: $Eu^{2+}$ disclosed in Japanese Patent Application Publication No. 2002-363554 and $(Y, Gd)_2(Al, Ga)_5O_{12}$: Ce disclosed in Japanese Patent Application Publication No. H09-218149 can be cited.

In such a configuration, when the ultraviolet light emitted by the LED or LD is irradiated on the phosphor, blue and yellow lights are emitted and a white lighting device is obtained by admixing these color lights.

As another example, a combination of an ultraviolet LED or LD emitting device at a wavelength of 330 to 420 nm; a green phosphor having an emission peak at a wavelength of 520 nm or longer and 550 nm or shorter by the excitation of the wavelength of 330 to 420 nm; a red phosphor having an emission peak at a wavelength of 600 nm or longer and 700 nm or shorter; and a blue phosphor of the present invention may be cited. As such a green phosphor, β-sialon: $Eu^{2+}$ which is described in Japanese Patent Application Publication No. 2005-255895 can be cited, and as a red phosphor, $CaSiAlN_3$: $Eu^{2+}$ which is described in WO2005/052087 can be cited. In this configuration, when the ultraviolet light emitted by the LED or LD is irradiated on the phosphor, light beams of three colors, i.e., red, green, and blue are emitted, and a white lighting device is obtained by admixing these color beams.

As another means, there is a combination of: an ultraviolet LED or LD which emits light at a wavelength of 330 to 420 nm; a green phosphor which is excited by the ultraviolet light at the wavelength and has an emission peak in a wavelength range of 520 nm or longer and 550 nm or shorter; a yellow phosphor which is excited by the ultraviolet light at the wavelength and has an emission peak in a wavelength range of 550 nm or longer and 600 nm or shorter; a red phosphor which is excited by the ultraviolet light at the wavelength and has an emission peak in a wavelength range of 600 nm or longer and 700 nm or shorter; and a phosphor of the present invention. As such a green phosphor, β-sialon: $Eu^{2+}$ can be cited as described in Japanese Patent Application Publication No. 2005-255895, as such a yellow phosphor, α-sialon: $Eu^{2+}$ described in Japanese Patent Application Publication No. 2002-363554 and $(Y, Gd)_2(Al, Ga)_5O_{12}$: Ce described in Japanese Patent Application Publication No. H09-218149 can be cited; and as such a red phosphor, $CaSiAlN_3$: Eu described in WO2005/052087 can be cited. In this configuration, when the ultraviolet light emitted by the LED or LD is irradiated on the phosphors, light beams of four colors, i.e., blue, green, yellow, and red are emitted, and a white or reddish electric bulb color lighting device is obtained by admixing these color beams.

The image display device of the present invention comprises: at least an excitation source and the phosphor of the present invention, and includes a vacuum fluorescent display (VFD), a field emission display (FED or SED), a plasma display panel (PDP), a cathode-ray tube (CRT), and the like. It has been confirmed that the phosphor of the present invention emits light by excitation of 100 to 190 nm vacuum ultraviolet light, 190 to 380 nm ultraviolet light, an electron beam, or the like, and the above image display devices are constructed by combining these excitation sources and the phosphor of the present invention.

The phosphor of the present application is excellent in the excitation efficiency of the electron beam such that the acceleration voltage of the electron beam is 10 V or higher and 30 kV or lower, and the phosphor is suitable for the application to the VFD, FED, SED, and CRT.

The FED is an image display device conducts luminescence by colliding an electron beam emitted from the field emission cathode and accelerated by the voltage onto the phosphor applied on the anode and it is in demand that the display conducts the luminescence with an acceleration voltage equal to or lower than 5 kV such that the display device will be improved in the luminescence performance by combining the phosphor of the present invention.

The present invention is described in more detail with examples to be shown below. However, these examples are disclosed only to help the understanding of the present invention with ease. Therefore, the present invention is not limited to these examples.

EXAMPLE

Examples 1 to 31

As powdery raw materials, silicon nitride powder having a mean particle diameter of 0.5 μm, oxygen content of 0.93 wt. %, and α-type content of 92% (Ube Industries, Ltd., SN-E10 grade), aluminum nitride powder having a specific surface area of 3.3 m²/g and an oxygen content of 0.79% (Tokuyama Corp., F grade), magnesium oxide powder of 99.9% purity (Konoshima Chemical Co., Ltd.), calcium carbonate powder of 99.99% purity (Kojundo Chemical Lab. Co., Ltd., reagent grade), calcium fluoride powder of 99.99% purity (Kojundo Chemical Lab. Co., Ltd., reagent grade), strontium carbonate powder of 99.9% purity (Kojundo Chemical Lab. Co., Ltd., reagent grade), barium carbonate powder of 99.9% purity (Kojundo Chemical Lab. Co., Ltd., reagent grade), zinc oxide powder of 99.99% purity (Kojundo Chemical Lab. Co., Ltd., reagent grade), and europium oxide powder of 99.9% purity (Shin-Etsu Chemical Co., Ltd.) were used.

Table 1 summarizes design compositions of Examples 1 to 31. In order to obtain compounds represented by a design compositional formula of $Eu_a A_b Al_c Si_d N_e O_f$ shown in Table 1 (A is an element of Mg, Ca, Sr, Ba, and Zn, and $a+b+c+d+e+f=1$), the powdery raw materials were weighed in mass ratios shown in Table 2. After mixing the weighed raw materials with a mortar and a pestle which were made of a silicon nitride sintered compact, the resultant mixture was passed through a sieve with an opening of 125 μm to obtain a powder aggregate having excellent fluidity. By allowing this powder aggregate to naturally fall into a boron nitride crucible having a diameter of 20 mm and a height of 20 mm, a bulk density of 15 to 30 vol % was obtained. The bulk density was calculated from the weight of the powder aggregate charged into the crucible, the internal volume of the crucible and the true density of the powder. Next, the crucible was set into a graphite resistance heating-type electric furnace. Firing operations were as follows. First, a firing atmosphere was evacuated with a diffusion pump, and then heated from the room temperature to 800° C. at a rate of 500° C./h. Thereafter, gaseous nitrogen having a purity of 99.9995 vol % was introduced at 800° C. to set gas pressure to 1 MPa, and the temperature was raised to 2000° C. at a rate of 500° C./h and held at 2000° C. for 4 hours in Examples 1 to 21. In Examples 22 to 31, the firing atmosphere was held at 2000° C. for 8 hours. A preset temperature of 2000° C. of the electric furnace includes an error of ±100° C.

TABLE 1

| | Designed Composition (atom %) | | | | | | | | | |
|---|---|---|---|---|---|---|---|---|---|---|---|
| | Si | Al | O | N | Mg | Ca | F | Sr | Ba | Zn | Eu |
| Example 1 | 2.857 | 46.524 | 0.143 | 50.333 | | | | | | | 0.143 |
| Example 2 | 2.857 | 46.190 | 0.476 | 50.000 | 0.333 | | | | | | 0.143 |
| Example 3 | 2.857 | 46.190 | 0.476 | 50.000 | | 0.333 | | | | | 0.143 |
| Example 4 | 2.848 | 46.037 | 0.142 | 49.834 | | 0.332 | 0.664 | | | | 0.143 |
| Example 5 | 2.857 | 46.190 | 0.476 | 50.000 | | | | 0.333 | | | 0.143 |
| Example 6 | 2.857 | 46.190 | 0.476 | 50.000 | | | | | 0.333 | | 0.143 |
| Example 7 | 2.857 | 46.190 | 0.476 | 50.000 | | | | | | 0.333 | 0.143 |
| Example 8 | 2.857 | 46.524 | 0.143 | 50.333 | | | | | | | 0.143 |
| Example 9 | 2.857 | 46.476 | 0.190 | 50.286 | | | | | | 0.048 | 0.143 |
| Example 10 | 2.857 | 46.381 | 0.286 | 50.190 | | | | | | 0.143 | 0.143 |
| Example 11 | 2.857 | 46.048 | 0.619 | 49.587 | | | | | | 0.476 | 0.143 |
| Example 12 | 2.857 | 45.095 | 1.571 | 48.905 | | | | | | 1.429 | 0.143 |
| Example 13 | 2.857 | 46.286 | 0.381 | 50.095 | | | | | | 0.333 | 0.048 |
| Example 14 | 2.857 | 46.048 | 0.619 | 49.857 | | | | | | 0.333 | 0.286 |
| Example 15 | 2.857 | 45.714 | 0.952 | 49.524 | | | | | | 0.667 | 0.286 |
| Example 16 | 2.857 | 46.476 | 0.190 | 50.286 | | | | | 0.048 | | 0.143 |
| Example 17 | 2.857 | 46.381 | 0.286 | 50.190 | | | | | 0.143 | | 0.143 |
| Example 18 | 2.857 | 46.048 | 0.619 | 49.857 | | | | | 0.476 | | 0.143 |
| Example 19 | 2.857 | 46.286 | 0.381 | 50.095 | | | | | 0.333 | | 0.048 |
| Example 20 | 2.857 | 46.048 | 0.619 | 49.857 | | | | | 0.333 | | 0.286 |
| Example 21 | 2.857 | 45.714 | 0.952 | 49.524 | | | | | 0.667 | | 0.286 |
| Example 22 | 2.857 | 46.524 | 0.143 | 50.333 | | | | | | | 0.413 |
| Example 23 | 2.857 | 46.381 | 0.286 | 50.190 | | | | | | 0.143 | 0.143 |
| Example 24 | 2.857 | 46.048 | 0.619 | 49.857 | | | | | | 0.476 | 0.143 |
| Example 25 | 2.857 | 46.048 | 0.619 | 49.857 | | | | | | 0.333 | 0.286 |
| Example 26 | 2.857 | 45.714 | 0.952 | 49.524 | | | | | | 0.667 | 0.286 |
| Example 27 | 2.857 | 46.381 | 0.286 | 50.190 | | | | | 0.143 | | 0.143 |
| Example 28 | 2.857 | 46.381 | 0.286 | 50.190 | | | | 0.143 | | | 0.143 |
| Example 29 | 2.857 | 46.381 | 0.286 | 50.190 | | 0.143 | | | | | 0.143 |
| Example 30 | 2.857 | 46.381 | 0.286 | 50.190 | 0.143 | | | | | | 0.143 |
| Example 31 | 2.857 | 46.333 | 0.333 | 50.143 | | | | | 0.095 | 0.095 | 0.143 |

TABLE 2

| | Designed Composition (mass %) | | | | | | | |
|---|---|---|---|---|---|---|---|---|
| | $Si_3N_4$ | AlN | MgO | $CaCO_3$ | $CaF_2$ | $SrCO_3$ | $BaCO_3$ | ZnO | $Eu_2O_3$ |
| Example 1 | 6.467 | 92.316 | | | | | | | 1.22 |
| Example 2 | 6.467 | 91.665 | 0.65 | | | | | | 1.22 |
| Example 3 | 6.406 | 90.789 | | 1.60 | | | | | 1.21 |

TABLE 2-continued

| | Designed Composition (mass %) | | | | | | | |
|---|---|---|---|---|---|---|---|---|
| | Si₃N₄ | AlN | MgO | CaCO₃ | CaF₂ | SrCO₃ | BaCO₃ | ZnO | Eu₂O₃ |
| Example 4 | 6.429 | 91.110 | | | 1.25 | | | | 1.21 |
| Example 5 | 6.358 | 90.104 | | | | 2.34 | | | 1.20 |
| Example 6 | 6.308 | 89.399 | | | | | 3.11 | | 1.19 |
| Example 7 | 6.425 | 91.061 | | | | | | 1.30 | 1.21 |
| Example 8 | 6.467 | 92.316 | | | | | | | 1.22 |
| Example 9 | 6.461 | 92.135 | | | | | | 0.19 | 1.22 |
| Example 10 | 6.449 | 91.776 | | | | | | 0.56 | 1.21 |
| Example 11 | 6.407 | 90.528 | | | | | | 1.86 | 1.21 |
| Example 12 | 6.292 | 87.050 | | | | | | 5.47 | 1.18 |
| Example 13 | 6.465 | 91.817 | | | | | | 1.31 | 0.41 |
| Example 14 | 6.366 | 89.946 | | | | | | 1.29 | 2.40 |
| Example 15 | 6.325 | 88.726 | | | | | | 2.57 | 2.38 |
| Example 16 | 6.444 | 91.890 | | | | | 0.45 | | 1.21 |
| Example 17 | 6.398 | 91.048 | | | | | 1.35 | | 1.20 |
| Example 18 | 6.242 | 88.193 | | | | | 4.39 | | 1.17 |
| Example 19 | 6.346 | 90.131 | | | | | 3.12 | | 0.40 |
| Example 20 | 6.251 | 88.319 | | | | | 3.08 | | 2.35 |
| Example 21 | 6.103 | 85.592 | | | | | 6.01 | | 2.30 |
| Example 22 | 6.467 | 92.316 | | | | | | | 1.22 |
| Example 23 | 6.449 | 91.776 | | | | | | 0.56 | 1.21 |
| Example 24 | 6.407 | 90.528 | | | | | | 1.86 | 1.21 |
| Example 25 | 6.366 | 89.946 | | | | | | 1.29 | 2.40 |
| Example 26 | 6.325 | 88.726 | | | | | | 2.57 | 2.38 |
| Example 27 | 6.398 | 91.048 | | | | | 1.35 | | 1.20 |
| Example 28 | 6.420 | 91.359 | | | | 1.01 | | | 1.21 |
| Example 29 | 6.441 | 91.657 | | 0.69 | | | | | 1.21 |
| Example 30 | 6.467 | 92.037 | 0.28 | | | | | | 1.22 |
| Example 31 | 6.409 | 91.112 | | | | | 0.90 | 0.37 | 1.21 |

Figure 12:
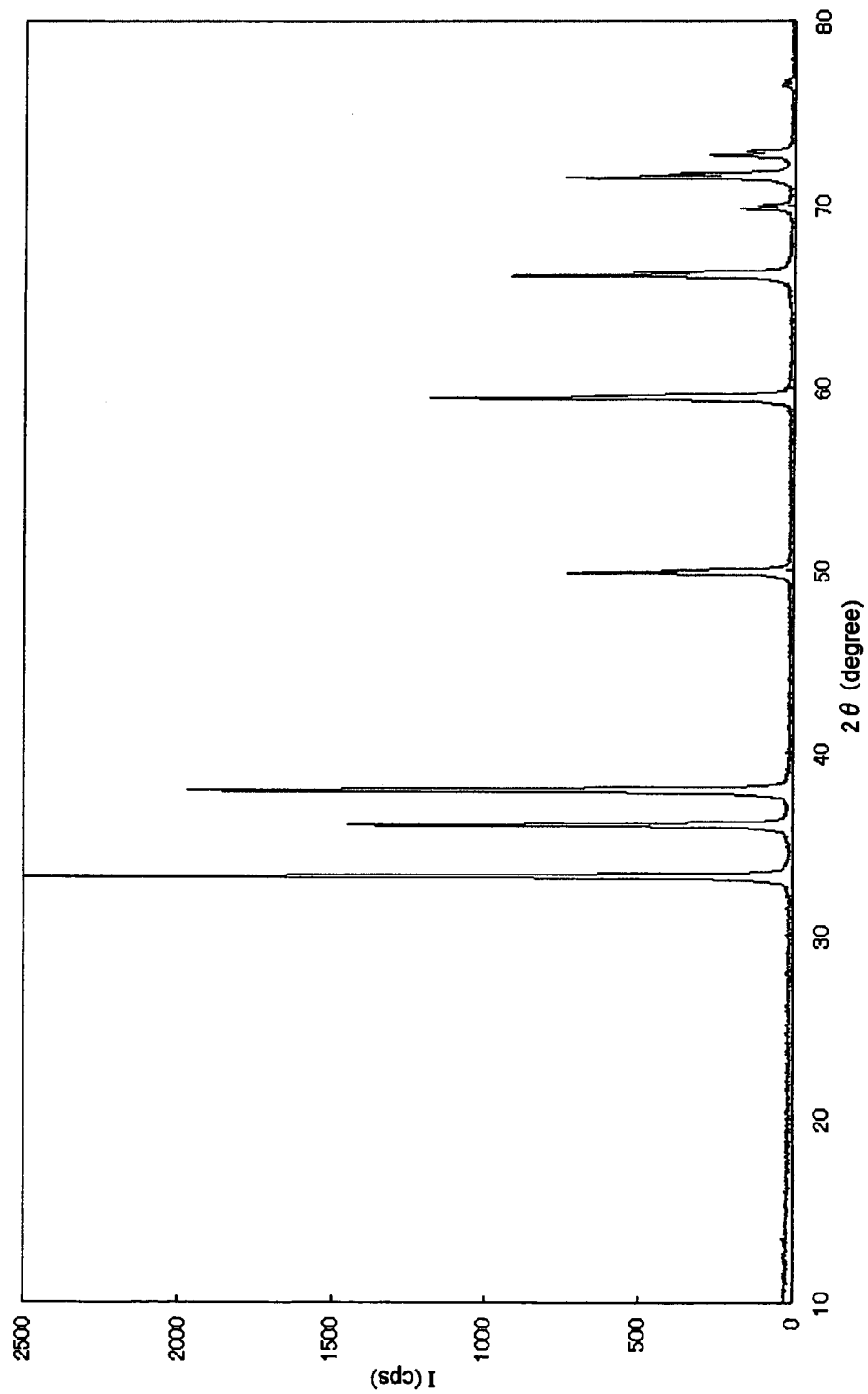
FIG. 12 shows an X-ray diffraction pattern of Example 7 measured by a powder X-ray diffractometer.

First, the synthesized samples were ground with a mortar and a pestle which were made of silicon nitride, and the powder X-ray diffraction measurements (XRD) using the Cu Kα line were conducted. As a result, the formation of crystals of a wurtzite-type AlN structure was confirmed from obtained charts. No other crystalline phases were detected. FIG. 12 shows an X-ray diffraction pattern of Example 7.

As a result of irradiating the thus-obtained powder samples with a lamp which emits light with a wavelength of 365 nm, the blue light emission was confirmed. The emission spectra and excitation spectra of these powder samples were measured using a spectrophotofluorometer. Table 3 summarizes the results of excitation peak wavelengths, emission peak wavelengths and fluorescence emission intensities in the photoluminescence measurements of Examples 1 to 31. As shown in Table 3, these powder samples were proved to be blue-emitting phosphors which have the peak of excitation spectrum in the wavelength range of 280 nm to 340 nm, and the peak of emission spectrum in the wavelength range of 430 nm to 500 nm under excitation at the peak wavelength of the excitation spectrum. Since the emission intensity (counted values) of the excitation spectrum and the emission spectrum changes depending on measuring instruments or conditions, the intensity is expressed in an arbitrary unit. That is, the values can be compared only within the present Examples measured on the same conditions. In this invention, the unit is normalized such that the emission intensity of a commercial YAG: Ce phosphor (Kasei Optonix, P46Y3) excited at 450 nm is set to be 1. FIGS. 1 to 5 show the excitation and emission spectra of Example 1, Example 2, Example 4, Example 5 and Example 6, respectively. In the drawings, peaks exceeding the display ranges of vertical axes indicate the direct light or second-order light of excitation light which does not belong to original spectra, and may hence be disregarded.

TABLE 3

| | Excitation Wavelength (nm) | Emission Wavelength (nm) | Emission Intensity (Arbitrary unit) |
|---|---|---|---|
| Example 1 | 329 | 471 | 1.33 |
| Example 2 | 329 | 471 | 1.51 |
| Example 3 | 329 | 471 | 0.57 |
| Example 4 | 333 | 465 | 0.81 |
| Example 5 | 331 | 455 | 0.94 |
| Example 6 | 328 | 458 | 1.38 |
| Example 7 | 330 | 465 | 1.72 |
| Example 8 | 331 | 471 | 1.39 |
| Example 9 | 330 | 471 | 1.44 |
| Example 10 | 332 | 471 | 1.49 |
| Example 11 | 330 | 470 | 1.52 |
| Example 12 | 288 | 472 | 0.31 |
| Example 13 | 300 | 476 | 0.63 |
| Example 14 | 330 | 471 | 1.52 |
| Example 15 | 332 | 471 | 1.31 |
| Example 16 | 333 | 466 | 1.67 |
| Example 17 | 331 | 461 | 1.73 |
| Example 18 | 327 | 455 | 0.51 |
| Example 19 | 329 | 454 | 0.93 |
| Example 20 | 283 | 470 | 0.55 |
| Example 21 | 286 | 471 | 0.36 |
| Example 22 | 328 | 471 | 2.28 |
| Example 23 | 299 | 471 | 2.30 |
| Example 24 | 300 | 470 | 2.60 |
| Example 25 | 326 | 470 | 2.40 |
| Example 26 | 293 | 470 | 1.97 |
| Example 27 | 326 | 464 | 2.47 |
| Example 28 | 326 | 464 | 2.59 |
| Example 29 | 327 | 465 | 1.74 |
| Example 30 | 326 | 470 | 2.30 |
| Example 31 | 326 | 463 | 2.54 |

Figure 6:
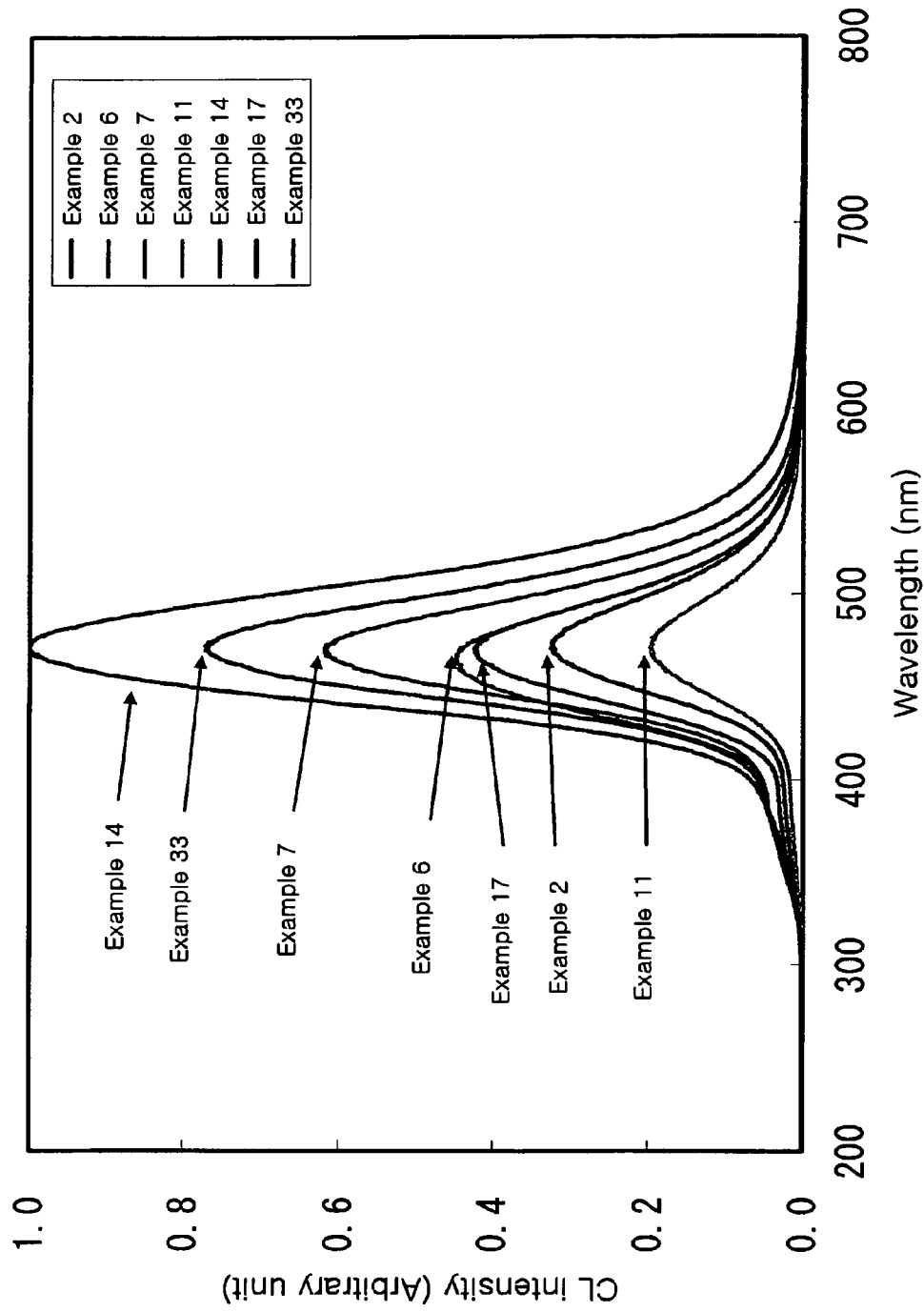
FIG. 6 shows a cathodoluminescence spectrum by the electron beam excitation.

Luminescence characteristics (cathodoluminescence, CL) upon electron beam irradiation were observed using a scanning electron microscope (SEM) equipped with a CL detector, and CL images were evaluated. This apparatus shows clearly the wavelength of light emitted at any place by detecting a visible light generated by electron beam irradiation and obtaining a photographic image being two-dimensional information. FIG. 6 shows the CL spectra of Example 2, Example 6, Example 7, Example 11, Example 14 and Example 17 at an accelerating voltage of 500 V. It was confirmed by emission spectrum observation that these phosphors are excited by electron beams to emit a blue light.

Example 32

To obtain a compound represented by the same compositional formula of $Eu_{0.00143}Al_{0.46524}Si_{0.02857}N_{0.50333}O_{0.00143}$ as in Example 1, silicon nitride powder, aluminum nitride powder and europium oxide powder were weighed in a proportion of 6.467 wt %, 92.316 wt % and 1.22 wt %, respectively, and mixed using a mortar and a pestle which were made of a silicon nitride sintered compact. Subsequently, the resultant mixture was allowed to naturally fall into a crucible made of boron nitride having a diameter of 20 mm and a height of 20 mm. Next, the crucible was set in a graphite resistance heating-type electric furnace. Firing operations were as follows. First, a firing atmosphere was evacuated with a diffusion pump, and then heated from room temperature to 800° C. at a rate of 500° C./h. Thereafter, gaseous nitrogen having a purity of 99.9995 vol % was introduced at 800° C. to set gas pressure to 1 MPa, and the temperature was raised to 2000° C. at a rate of 500° C./h and maintained at 2000° C. for 24 hours.

The synthesized sample was ground with a mortar and a pestle which were made of silicon nitride, and the powder X-ray diffraction measurements (XRD) using the Cu Kα line were conducted. From an obtained chart, the formation of a crystal of the wurtzite-type AlN structure was confirmed. No other crystalline phases were detected.

Figure 7:
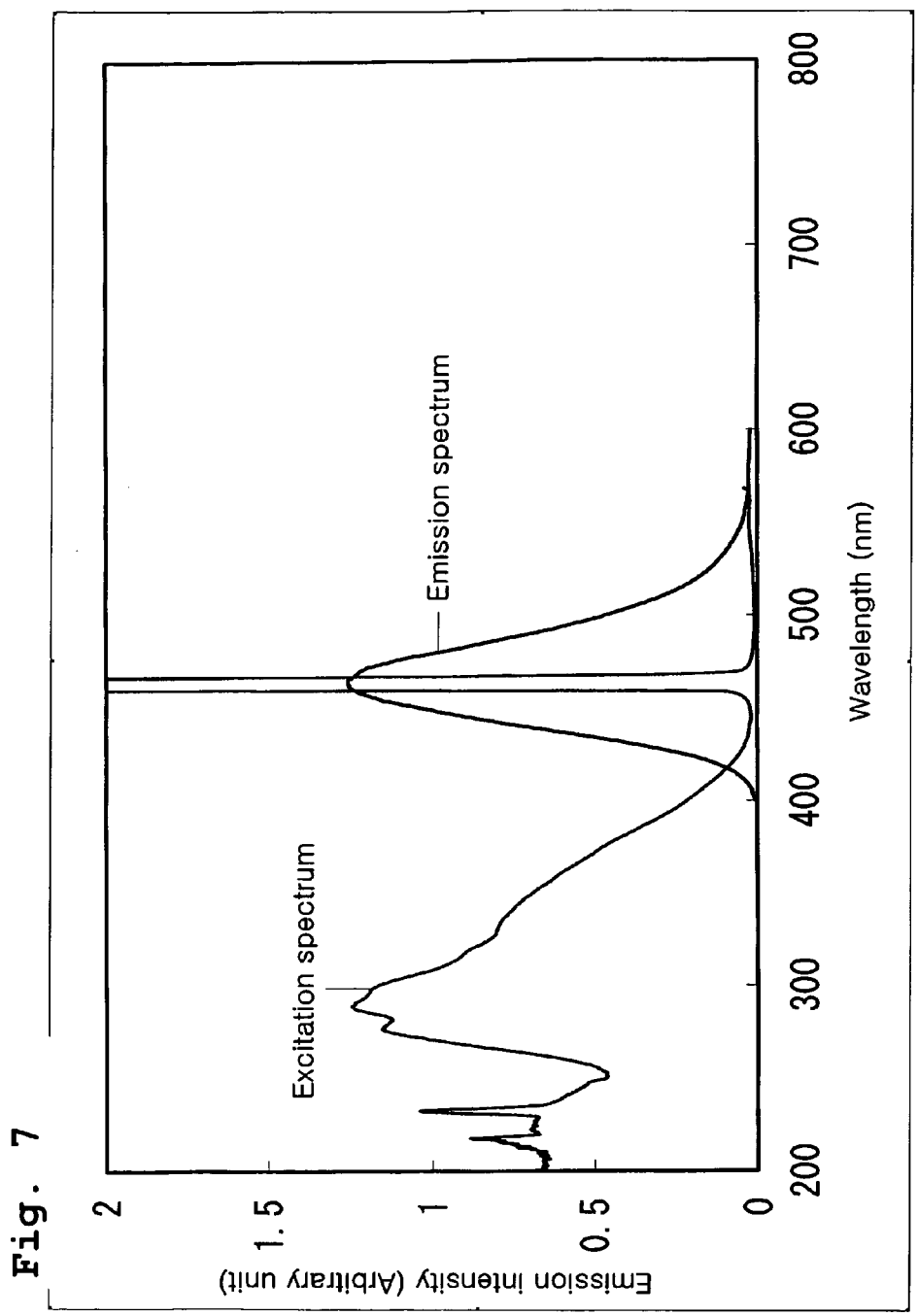
FIG. 7 shows an excitation spectrum and an emission spectrum measured in fluorescence measurement of Example 32.

By irradiating this powder with a lamp which emits light of a wavelength of 365 nm, a light emission in blue was confirmed. As a result of measuring the emission spectrum and excitation spectrum of this powder (FIG. 7) with a spectrophotofluorometer, this powder proved to be a phosphor having the peak of the excitation spectrum at 286 nm, and having the peak at a blue light of 465 nm in an emission spectrum under excitation at 286 nm. The emission intensity of the peak was 1.26 counts.

Luminescence characteristics (cathodoluminescence, CL) upon electron beam irradiation were observed using a SEM equipped with a CL detector. It was confirmed in an emission spectrum observation that this phosphor emits a blue light at a wavelength of 465 nm by electron beam excitation.

Example 33

To obtain a compound given by the same compositional formula of $Eu_{0.0028519}Al_{0.464067}Si_{0.0283553}N_{0.501874}O_{0.0028519}$ as in Example 1, silicon nitride powder, aluminum nitride powder, and europium oxide powder were weighed in a proportion of 6.359 wt %, 91.234 wt % and 2.407 wt %, respectively, and mixed with a ball mill in hexane for 2 hours using balls and a pot made of a silicon nitride sintered compact. Subsequently, the hexane was removed with a rotary evaporator. Next, the resultant mixture was ground using a mortar and pestle which were made of a silicon nitride sintered compact, and then powder aggregate having excellent fluidity was obtained by passing the ground mixture through a sieve with an opening of 64 μm. When this powder aggregate was allowed to naturally fall into a boron nitride crucible having a diameter of 20 mm and a height of 20 mm, a bulk density of 15 vol % was obtained. The bulk density was calculated from the weight of the powder aggregate charged into the crucible, the internal volume of the crucible, and the true density (3.1 g/cm³) of the powder.

Next, the crucible was set in a graphite resistance heating-type electric furnace. In the firing operation, a firing atmosphere was first evacuated with a diffusion pump, and then heated from the room temperature to 800° C. at a rate of 500° C./h. Thereafter, gaseous nitrogen having a purity of 99.9995 vol % was introduced at 800° C. to set gas pressure to 1 MPa, and the temperature was raised to 2000° C. at a rate of 500° C./h and held at 2000° C. for 2 hours.

The synthesized sample was ground using a mortar and a pestle which were made of silicon nitride, and the powder X-ray diffraction measurements (XRD) using the Cu Kα line were conducted. As a result, the formation of a crystal of the wurtzite-type AlN structure was confirmed from an obtained chart. No other crystalline phases were detected.

By irradiating this powder with a lamp which emits light of a wavelength of 365 nm, the light emission in blue was confirmed. As a result of measuring the emission spectrum and excitation spectrum of this powder using a spectrophotofluorometer, this powder was proved to be a phosphor having the peak of the excitation spectrum at 327 nm, and having the peak at a blue light of 471 nm in an emission spectrum under excitation at 327 nm. The emission intensity of the peak was 2.27 counts.

Figure 8:
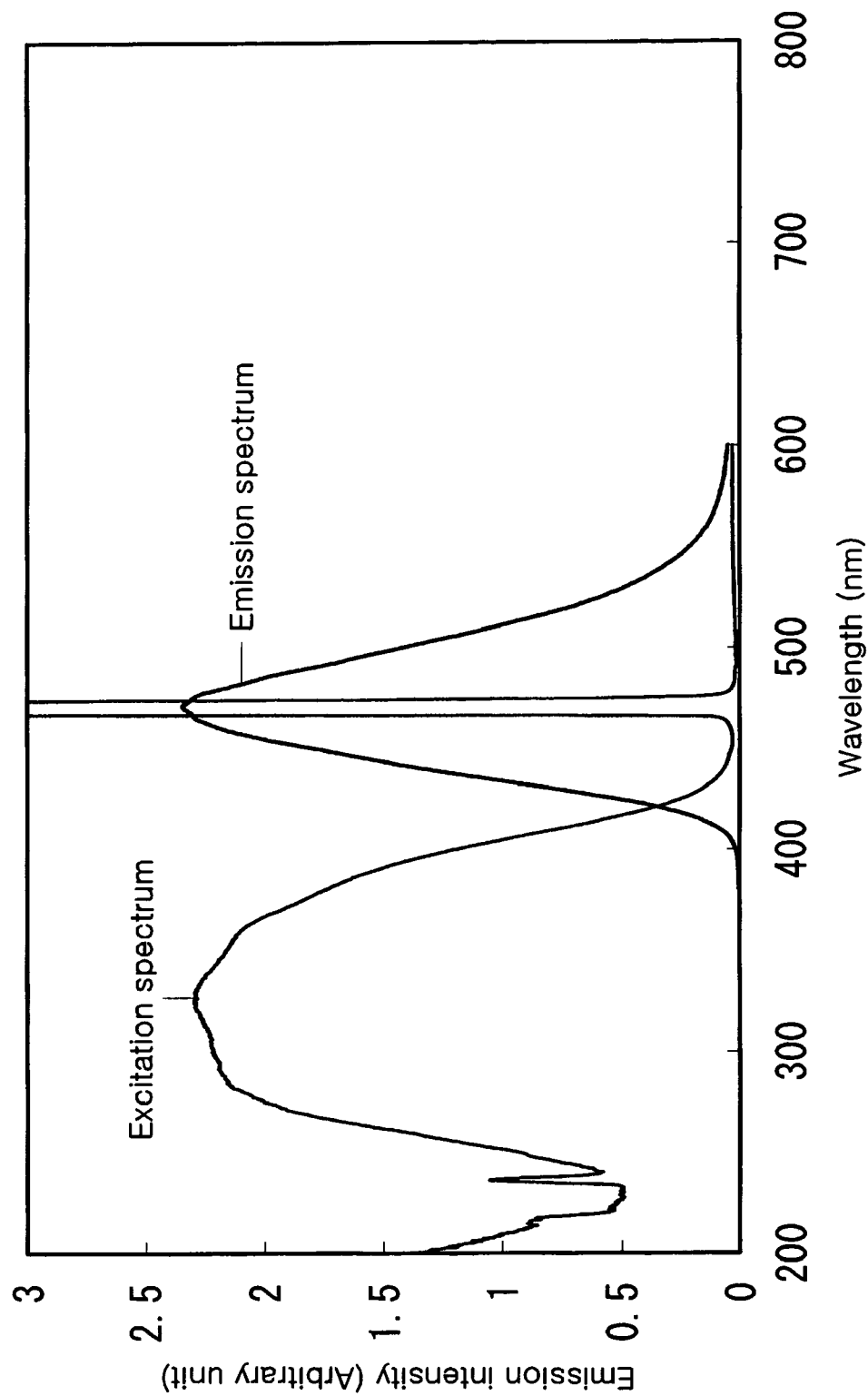
FIG. 8 shows an excitation spectrum and an emission spectrum measured in fluorescence measurement of Example 33.

This powder was coarsely ground and put into a beaker made of Teflon (registered trademark), and then 5 ml of hydrofluoric acid, 5 ml of sulfuric acid, and 390 ml of distilled water were added. After agitating the beaker content for 30 minutes at the room temperature, the resultant mixture was washed with distilled water and dried. As a result of measuring the emission spectrum and excitation spectrum of this powder using a spectrophotofluorometer, this powder was proved to be a phosphor having the peak of the excitation spectrum at 329 nm, and having the peak at a blue light of 471 nm in an emission spectrum under excitation at 329 nm. FIG. 8 shows a fluorescence spectrum. The emission intensity of the peak was 2.36 counts. It is thought that impurity components, such as a glass phase, were removed by acid treatment, and emission intensity improved accordingly.

Luminescence characteristics (cathodoluminescence, CL) upon the electron beam irradiation were observed using a SEM equipped with a CL detector. FIG. 6 shows CL spectra. It was confirmed in an emission spectrum observation that this phosphor is excited by electron beams to emit a blue light at a wavelength of 465 nm.

Figure 9:
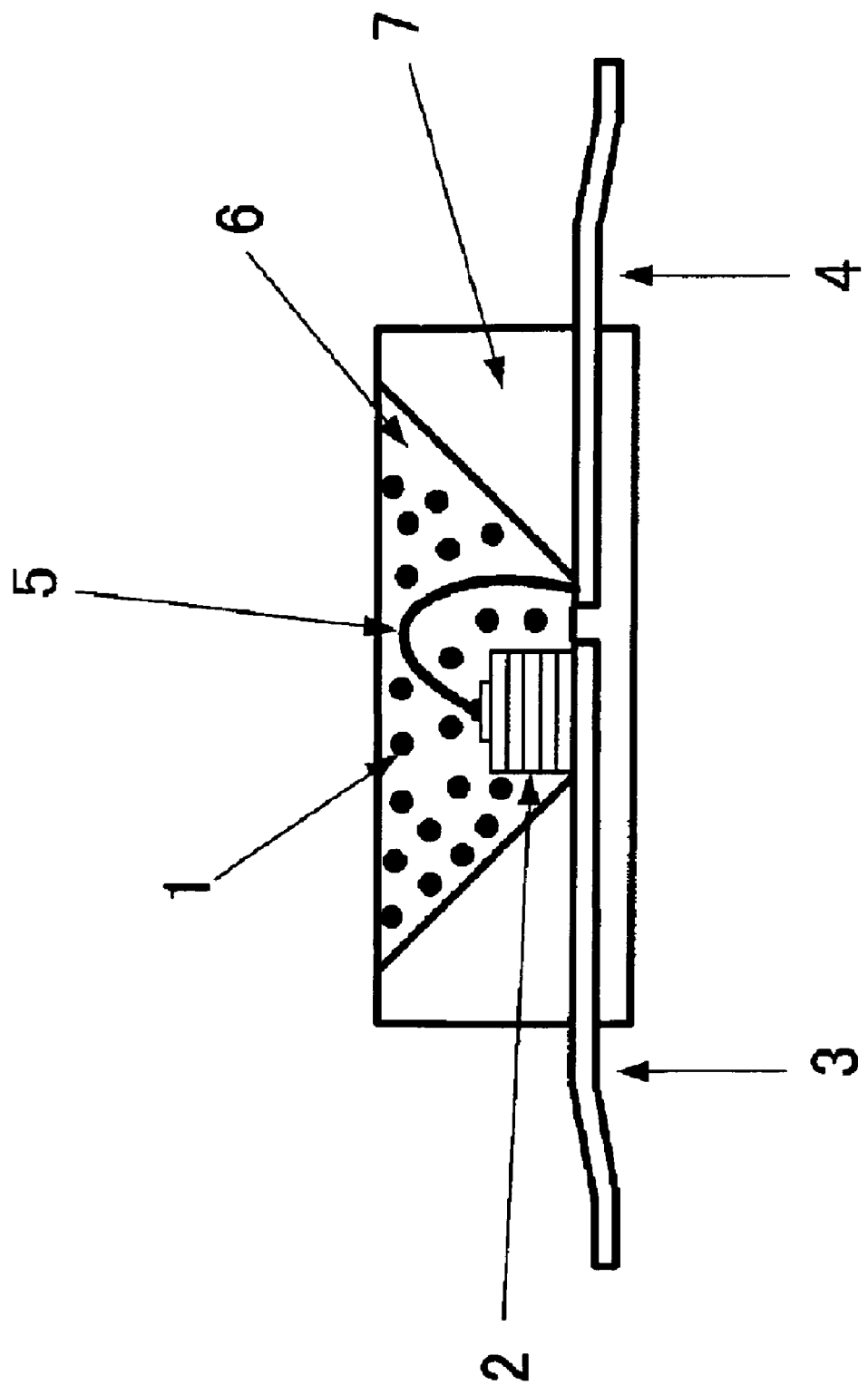
FIG. 9 is a general diagram showing a lighting device (LED lighting device) according to the present invention.

Next, a lighting device using the phosphors comprising the nitrides of the present invention will be descried. FIG. 9 shows a schematic structural drawing of a white LED as a lighting device. A mixture phosphor 1 containing the phosphor comprising the nitride of this invention and other phosphors, and a near-ultraviolet LED chip 2 of 380 nm as a light emitting device are used. A coating of the mixture phosphor 1 prepared by dispersing the phosphor of Example 33 of this invention and a Ca-α-sialon: Eu yellow phosphor having a composition of $Ca_{0.75}Eu_{0.25}Si_{8.625}Al_{3.375}O_{1.125}N_{14.875}$ into a resin layer 6 is put on the LED chip 2 and arranged in a container 7. When electric currents flow through conductive terminals 3 and 4, the electric currents are supplied to the LED chip 2 via a wire bond 5. The LED chip 2 then emits light of 380 nm, which excites the phosphor mixture 1 containing the yellow phosphor and the blue phosphor to emit a yellow and blue lights, respectively. The yellow and blue colors from these phosphors are mixed to yield an illuminating device emitting a white light. This lighting device is characterized by high emission efficiency.

An illuminating device produced by a composition design different from the above composition is shown. First, a 380 nm ultraviolet LED chip 2 is used as a light emitting device, and the phosphor of Example 33 of this invention, a green phosphor (β-sialon: Eu) according to Example 1 of Patent document 3, and a red phosphor (CaSiAlN₃: Eu) according to Example 1 of Patent document 6 are dispersed into a resin layer 6 to form a mixture phosphor 1. The resultant mixture is coated on the ultraviolet LED chip 2. When electric currents flow through conductive terminals 3 and 4, the LED chip 2 emits light of 380 nm, which excites the blue phosphor, the green phosphor, and the red phosphor to emit blue, green, and red lights, respectively. The light from these phosphors is mixed to yield an illuminating device emitting a white light.

Figure 10:
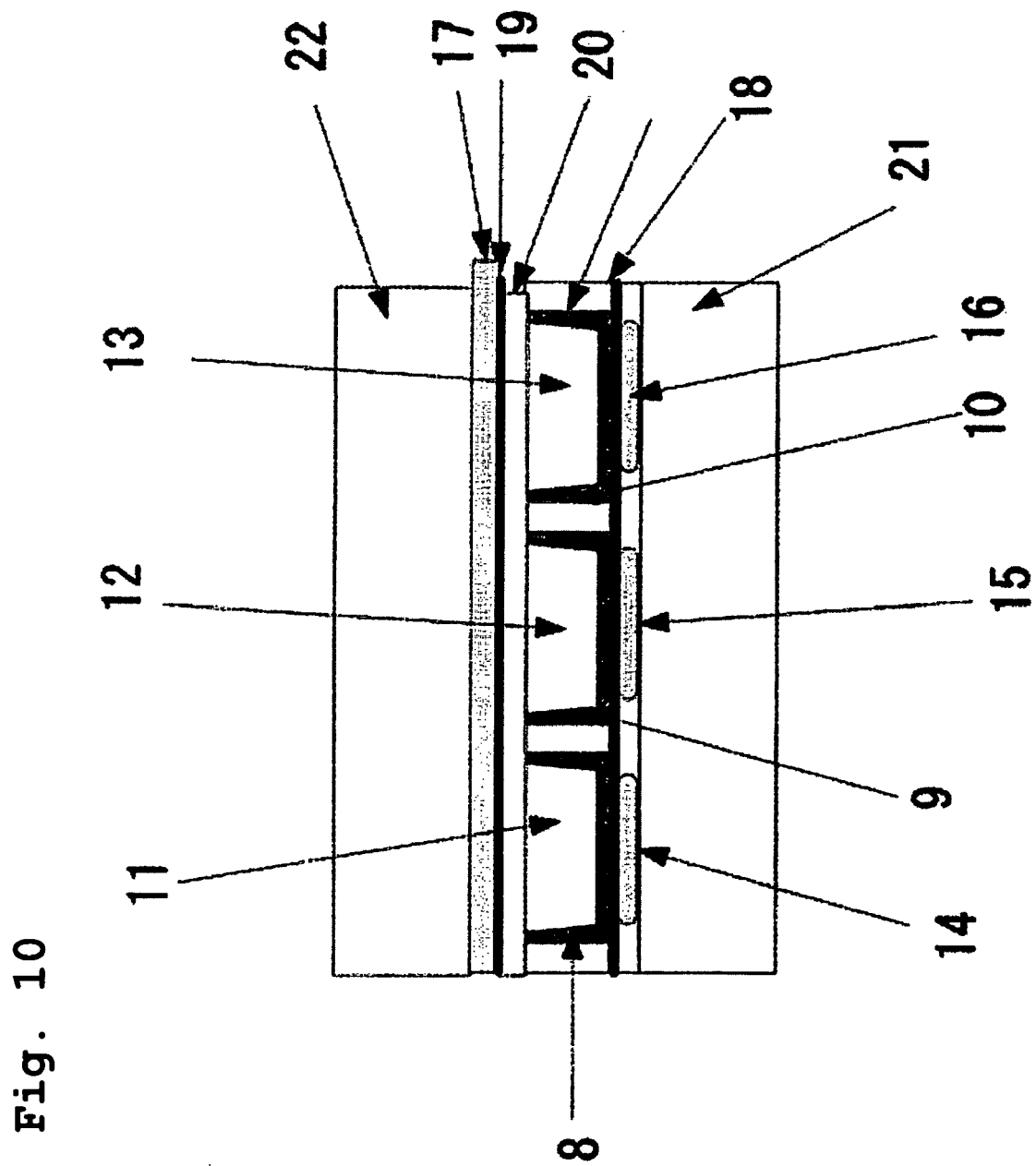
FIG. 10 is a general diagram showing an image display device (Plasma Display Panel) according to the present invention.

Next, an example of designing an image display device using the nitride phosphor of this invention will be described. FIG. 10 shows a schematic diagram showing a principle of a plasma display panel as an image display device. A red phosphor (Y(PV)O₄: Eu) 8, the green phosphor (Zn₂SiO₄: Mn) 9; and a blue phosphor 10 of Example 33 of the present invention are applied to the internal surfaces of respective cells 11, 12 and 13. When electric currents are supplied to electrodes 14, 15, 16 and 17, vacuum ultraviolet radiation is generated by Xe discharge in the cells, and the phosphors are excited by this radiation to emit red, green, and blue visible lights. The emitted light is observed from the outside via a protection layer 20, a dielectric layer 19, and a glass substrate 22, and functions as an image display.

Figure 11:
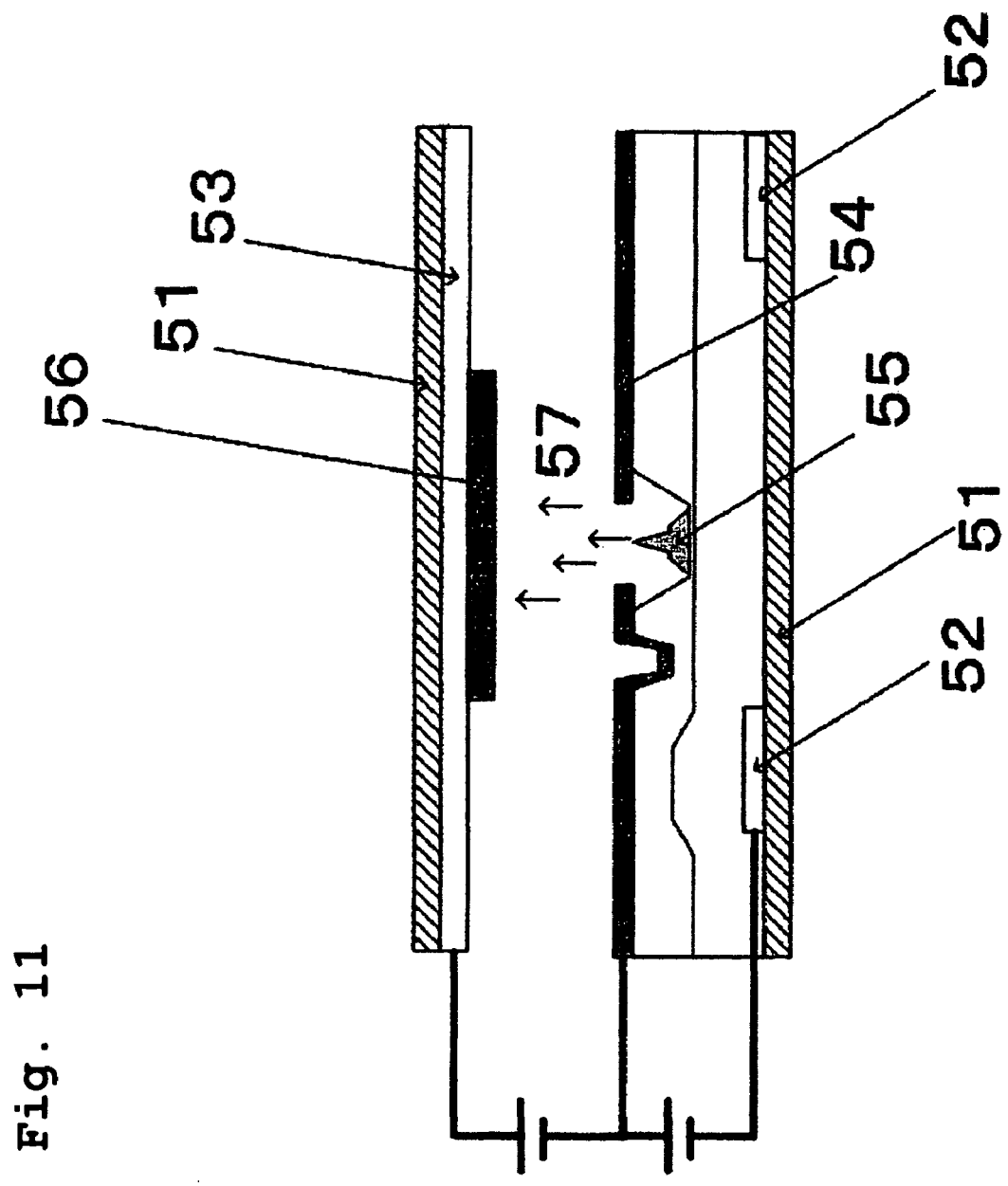
FIG. 11 is a general diagram showing an image display device (Field Emission Display) according to the present invention.

FIG. 11 is a schematic diagram showing a principle of a field emission display panel as an image display device. The green phosphor 56 of Example 33 of the present invention is applied to the internal surface of an anode 53. By applying voltage between a cathode 52 and a gate 54, electrons 57 are emitted from an emitter 55. The electrons are accelerated by voltage between the anode 53 and the cathode and impinge on the phosphor 56 to excite the phosphor to emit light. The entire structure is protected by glass 51. The drawing shows a single light emission cell comprising one emitter and one phosphor. However, an actual display emitting a variety of colors is built by arranging a large number of green and red cells besides blue cells. Although the phosphors used for the green and red cells are not particularly specified, phosphors which show high brightness under low-voltage electron beams are preferable.

INDUSTRIAL APPLICABILITY

The nitride phosphor of the present invention show a blue emission different from the emission of conventional sialon, and show only small deterioration of phosphor brightness when exposed to an excitation source. Hence the nitride phosphor is used suitably for VFD, FED, PDP, CRT, white LED, and the like. In the future, it is expected to be extensively utilized in various display devices utilizing the electron excitation such that it contributes to the development of the industry.

While the foregoing describes the present invention in relation to illustrations and examples, it is understood that it is not intended to limit the scope of the invention to the illustrations and examples described herein. On the contrary, it is intended to cover all alternative modifications and equivalents that may be included in the spirit and the scope of the invention as defined by the appended claims.

What is claimed is:

1. A phosphor comprising:
   an inorganic crystal having a crystal structure of an AlN crystal or an AlN solid solution crystal, the inorganic crystal comprising: a wurtzite-type AlN crystal structure, a crystal structure selected from 2H⁶; 27R; 21R; 12H; 15R; and 8H, a crystal structure having an Al(O, N)₄ tetrahedron skeleton therein, or a combination thereof; and
   at least europium incorporated therein as a solid solution,
   wherein a composition of the phosphor is given by $Eu_a A_b Al_c Si_d O_e N_f$ (here, A is one or two or more kinds of elements selected from Mg, Ca, Sr, Ba, Zn, and Cd, and a+b+c+d+e+f=1) and following conditions are satisfied:

$0.00001 \leq a \leq 0.1$ (i);

$0.0001 \leq b \leq 0.2$ (ii);

$0.4 \leq c \leq 0.55$ (iii);

$0.005 \leq d \leq 0.2$ (iv);

$0.001 \leq e \leq 0.05$ (v); and $0.3 \leq f \leq 0.55$ (vi), and wherein the phosphor emits fluorescence being derived from a divalent europium ion and having a peak at a wavelength in a range of 430 nm to 500 nm upon exposure to an excitation source.

2. The phosphor according to claim 1, further comprising: oxygen incorporated therein as a solid solution.

3. The phosphor according to claim 1, further comprising: the element A and silicon incorporated therein as a solid solution.

4. The phosphor according to claim 3 wherein the element A is Zn.

5. The phosphor according to claim 3 wherein the element A is Ba.

6. The phosphor according to claim 1, wherein the excitation source is any one of an ultraviolet or visible light having a wavelength of 100 nm to 420 nm, an electron beam, and an X-ray.

7. A manufacturing method of a phosphor comprising:
   holding a raw material mixture comprising at least: Eu metal, oxide, carbonate, nitride, fluoride, chloride, oxynitride, or a combination thereof; A metal, oxide, carbonate, nitride, fluoride, chloride, oxynitride, or a combination thereof (here, A is one or two or more kinds of elements selected from Mg, Ca, Sr, Ba, Zn, and Cd); silicon nitride; and aluminum nitride, in a bulk density of 40% or less; and
   firing the thus-held mixture in a nitrogen atmosphere of 0.1 MPa or higher to 100 MPa or lower in a temperature range of 1500° C. or higher and 2200° C. or lower such that the phosphor of claim 1 is produced.

8. The manufacturing method of the phosphor according to claim 7 wherein a content (atomic %) of silicon atom contained in the raw material mixture is lower than a content (atomic %) of aluminum atom.

9. A lighting device comprising: an emission source emitting light of wavelength of 330 to 420 nm; and a phosphor, wherein the phosphor comprises a phosphor recited in claim 1.

10. The lighting device according to claim 9, wherein the emission source comprises a LED or a LD, wherein the phosphor further comprises: a green phosphor having an emission peak at a wavelength of 520 nm to 550 nm by an excitation light of 330 to 420 nm; and a red phosphor having an emission peak at a wavelength of 600 nm to 700 nm by the excitation light of 330 to 420 nm.

11. The lighting device according to claim 9, wherein the emission source comprises: a LED or a LD, and wherein the phosphor further comprises a yellow phosphor having an emission peak at a wavelength of 550 nm to 600 nm by an excitation light of 330 to 420 nm.

12. An image display device comprising: an excitation source and a phosphor, wherein the phosphor comprises: a phosphor recited in claim 1.

13. The image display device according to claim 12, comprising: any one of a fluorescent display tube (VFD), a field emission display (FED or SED), and a cathode-ray tube (CRT), wherein the excitation source is an electron beam whose acceleration voltage is in range of 10 V or higher to 30 kV or lower.

* * * * *